US008933367B2

(12) United States Patent
Kakui et al.

(10) Patent No.: US 8,933,367 B2
(45) Date of Patent: Jan. 13, 2015

(54) LASER PROCESSING METHOD

(75) Inventors: Motoki Kakui, Yokohama (JP); Hiroshi Kohda, Yokohama (JP); Yasuomi Kaneuchi, Yokohama (JP); Shinobu Tamaoki, Yokohama (JP); Shigehiro Nagano, Yokohama (JP); Yoshiyuki Uno, Okayama (JP); Yasuhiro Okamoto, Okayama (JP); Kenta Takahashi, Okayama (JP)

(73) Assignees: Sumitomo Electric Industries, Ltd., Osaka-shi (JP); National University Corporation Okayama University, Okayama-shi (JP)

( * ) Notice: Subject to any disclaimer, the term of this patent is extended or adjusted under 35 U.S.C. 154(b) by 316 days.

(21) Appl. No.: 13/369,076

(22) Filed: Feb. 8, 2012

(65) Prior Publication Data

US 2012/0255935 A1 Oct. 11, 2012

Related U.S. Application Data

(60) Provisional application No. 61/441,026, filed on Feb. 9, 2011, provisional application No. 61/535,763, filed on Sep. 16, 2011.

(30) Foreign Application Priority Data

Mar. 7, 2011 (JP) ................. 2011-049375

(51) Int. Cl.
*B23K 26/36* (2014.01)
*B23K 26/00* (2014.01)
(Continued)

(52) U.S. Cl.
CPC ............ *B23K 26/0042* (2013.01); *B23K 26/36* (2013.01); *B23K 26/365* (2013.01);
(Continued)

(58) Field of Classification Search
CPC ........ B23K 26/06; B23K 26/36; B23K 26/00; B23K 26/365; B23K 26/367; B23K 26/4075; C03B 33/09; H02L 21/301; H01L 21/302
USPC ............. 219/121.67–121.72, 121.76, 121.77, 219/121.85, 121.61; 438/22, 460, 462, 463
See application file for complete search history.

(56) References Cited

U.S. PATENT DOCUMENTS

2005/0205536 A1 9/2005 Norikane et al.
2006/0108338 A1* 5/2006 Nishiwaki et al. ....... 219/121.72
(Continued)

FOREIGN PATENT DOCUMENTS

JP 2002-192370 7/2002
JP 2002-205180 7/2002
(Continued)

OTHER PUBLICATIONS

"Stealth Dicing Technical Information for MEMS," Hamamatsu Photonics K.K. (Sep. 2011).
(Continued)

*Primary Examiner* — Samuel M Heinrich
(74) *Attorney, Agent, or Firm* — Venable LLP; Michael A. Sartori; Tamatane J. Aga

(57) ABSTRACT

There is obtained a laser processing method by which an excellent shape of a cut surface can be achieved and an increase in cost can be suppressed. A laser processing method includes the steps of: preparing a material to be processed; and forming a modified area in the material to be processed, by irradiating the material to be processed with laser beam. In the aforementioned step, pulsed laser beam having a continuous spectrum is focused with a lens, thereby forming a focusing line constituted by a plurality of focuses that are obtained by predetermined bands forming the continuous spectrum of the laser beam, and the material to be processed is irradiated with the laser beam such that at least a part of the focusing line is located on a surface of the material to be processed, thereby forming the modified area on an axis of the focusing line.

23 Claims, 31 Drawing Sheets

(51) Int. Cl.
  *B23K 26/08* (2014.01)
  *B23K 26/10* (2006.01)
  *B23K 26/38* (2014.01)
  *B23K 26/40* (2014.01)
  *H01L 21/302* (2006.01)

(52) U.S. Cl.
  CPC ............ *B23K 26/367* (2013.01); *H01L 21/302* (2013.01); *B23K 26/0063* (2013.01); *B23K 26/0869* (2013.01); *B23K 26/10* (2013.01); *B23K 26/38* (2013.01); *B23K 26/4075* (2013.01)
  USPC ................. 219/121.69; 219/121.61; 438/463

(56) References Cited

U.S. PATENT DOCUMENTS

| | | |
|---|---|---|
| 2006/0289410 A1 | 12/2006 | Morita et al. |
| 2007/0202619 A1* | 8/2007 | Tamura et al. ................. 438/22 |
| 2007/0235418 A1 | 10/2007 | Park et al. |
| 2009/0277884 A1 | 11/2009 | Uno et al. |
| 2011/0226747 A1* | 9/2011 | Furuta ...................... 219/121.72 |
| 2012/0061356 A1 | 3/2012 | Fukumitsu |

FOREIGN PATENT DOCUMENTS

| | | |
|---|---|---|
| JP | 3408805 | 5/2003 |
| JP | 3626442 | 3/2005 |
| JP | 2005-262290 | 9/2005 |
| JP | 2006-305586 | 11/2006 |
| JP | 2007-260773 | 10/2007 |
| JP | 2008-006492 | 1/2008 |
| JP | 2009-226479 | 10/2009 |
| JP | 2010-082645 | 4/2010 |
| JP | 2010-158686 | 7/2010 |
| WO | WO-2005/084874 A1 | 9/2005 |
| WO | WO-2011/018989 | 2/2011 |

OTHER PUBLICATIONS

"Solutions-Stealth Dicing Application," DISCO Corporation [online, searched on Feb. 2, 2011], <URL: http://www.disco.co.jp/jp/solution/library/stealth.html>.

* cited by examiner

LASER PROCESSING METHOD

BACKGROUND OF THE INVENTION

1. Field of the Invention

The present invention relates to a laser processing method, and more particularly to a laser processing method used for cutting and cleaving or division processing of a material to be processed.

2. Description of the Background Art

A laser processing method using laser beam to cut and cleave a material to be processed has been conventionally known (see, for example, Japanese Patent Laying-Open No. 2002-192370 (hereinafter referred to as PTL 1), Japanese Patent Laying-Open No. 2002-205180 (hereinafter referred to as PTL 2) and Japanese Patent Laying-Open No. 2008-6492 (hereinafter referred to as PTL 3)).

PTL 1 discloses that a wafer-like material to be processed is irradiated with laser beam having a pulse width of 1 μs or less such that a focusing point (focus) of the laser beam is arranged inside the material to be processed, thereby forming a modified area, which serves as a starting point of cutting processing, inside the material to be processed. PTL 2 discloses that a wafer-like material to be processed is irradiated with laser beam having a pulse width of 1 μs or less such that a focusing point (focus) of the laser beam is arranged inside the material to be processed, and the position of the focusing point in the incidence direction of the laser beam is changed, thereby forming a plurality of modified areas, which serve as a starting point of cutting processing, in the depth direction inside the material to be processed. PTL 3 discloses that in cutting a sapphire substrate with laser beam, laser beam having an extremely-short pulse width in a femtosecond range is used to minimize damage caused by irradiation with the laser beam.

The aforementioned conventional laser processing methods, however, have had the following problems. Specifically, in the laser processing method disclosed in PTL 1, the irradiated laser beam has a single wavelength and is focused on one point inside the material to be processed. Therefore, the length of the modified area in the thickness direction of the material to be processed cannot be increased too much. As a result, the direction and the like of a crack developing from the modified area in cutting processing are not fixed in some cases, which may result in variations in the shape of a cut surface. In the laser processing method disclosed in PTL 2, although the plurality of modified areas can be formed in the depth direction of the material to be processed, laser beam irradiation must be performed a plurality of times to form the plurality of modified areas, which causes a problem of an increase in the number of steps in the manufacturing process and thus an increase in the manufacturing cost. In the laser processing method disclosed in PTL 3, although the laser beam having an extremely-short pulse width in the femtosecond range is used, the industrial use of such laser beam having an extremely-short pulse width is not practical in terms of the apparatus cost, the stability of the process and the like.

As described above, it has been conventionally difficult to cut the material to be processed by laser processing in a short time and at low cost, and to achieve the excellent shape of the cut surface.

SUMMARY OF THE INVENTION

The present invention has been made to solve the above problems and an object of the present invention is to provide a laser processing method by which an excellent shape of a cut surface can be achieved and an increase in cost can be suppressed.

A laser processing method according to the present invention includes the steps of: preparing a material to be processed; and forming a modified area in the material to be processed, by irradiating the material to be processed with laser beam. In the step of forming a modified area, pulsed laser beam having a continuous spectrum is focused with a lens, thereby forming a focusing line constituted by a plurality of focuses that are obtained by predetermined bands (predetermined wavelength components) forming the continuous spectrum of the laser beam, and the material to be processed is irradiated with the laser beam such that at least a part of the focusing line is located on a surface of the material to be processed, thereby forming the modified area on an axis of the focusing line. It is to be noted that the modified area herein refers to an area having a texture different from a surrounding texture in the material to be processed, or an area having a reduced strength as compared with the surrounding texture, and specifically an area where a single crystal has changed into an amorphous or polycrystalline structure. The axis of the focusing line refers to an axis along the focusing line and includes both a portion overlapping with the focusing line and a portion extending along the focusing line outside the focusing line.

With such a configuration, since the wavelength components forming the continuous spectrum are focused and thereby the focusing line (collection of the focusing points) is formed, the modified area extending long in the irradiation direction of the laser beam (e.g., in the depth direction) can be formed in an area where the focusing line is located or on the axis of the focusing line in the material to be processed. Therefore, when the material to be processed is cut using the modified area as an origination area, the shape of a cut surface can be flattened in a stable manner because the modified area extending long in the certain direction preexists. In addition, since the modified area extending long in the irradiation direction of the laser beam can be formed by one laser irradiation, the process cost can be reduced as compared with the case where laser irradiation is repeated a plurality of times.

A laser processing method according to the present invention includes the steps of: preparing a material to be processed; and forming a modified area in the material to be processed, by irradiating the material to be processed with laser beam of pulsed laser. In the step of forming a modified area, the pulsed laser of a predetermined spectral band having a spectral range of 50 nm or more is focused as the laser beam by focusing means, and thereby a focusing portion of each spectral component included in the pulsed laser is formed, for each pulse shot, on a straight line in a focusing direction as a predetermined focusing area. The material to be processed is irradiated with the laser beam, and thereby the modified area generated from the focusing area on the straight line is formed inside the material to be processed. It is to be noted that each pulse shot as described above refers to irradiated pulsed laser for every one pulse on a time axis.

In addition, a laser processing method according to the present invention includes the steps of: preparing a material to be processed; and forming a modified area in the material to be processed, by irradiating the material to be processed with laser beam of pulsed laser. In the step of forming a modified area, the pulsed laser of a predetermined spectral band including a continuous spectral range of 50 nm or more is focused as the laser beam by focusing means, and thereby a focusing portion of each spectral range included in the pulsed laser is formed, for each pulse shot, linearly along a focusing direction as a predetermined focusing area. The material to be processed is irradiated with the laser beam, and thereby the modified area generated from the linear focusing area is formed inside the material to be processed.

With such a configuration, the pulsed laser of the predetermined spectral band is focused as the laser beam, and thereby the focusing portion of each spectral component included in the pulsed laser is formed on the straight line in the focusing direction or linearly along the focusing direction as the focusing area. Therefore, the modified area generated from the focusing area extending linearly can be formed inside the material to be processed. Thus, when the material to be processed is cut using the modified area as an origination area, the shape of a cut surface can be flattened in a stable manner because the modified area extending long in the certain direction preexists. In addition, since the modified area extending in the focusing direction of the laser beam can be formed by one laser irradiation, the process cost can be reduced as compared with the case where laser irradiation is repeated a plurality of times.

According to the present invention, there can be realized a laser processing method by which an excellent shape of a cut surface can be achieved and an increase in cost can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
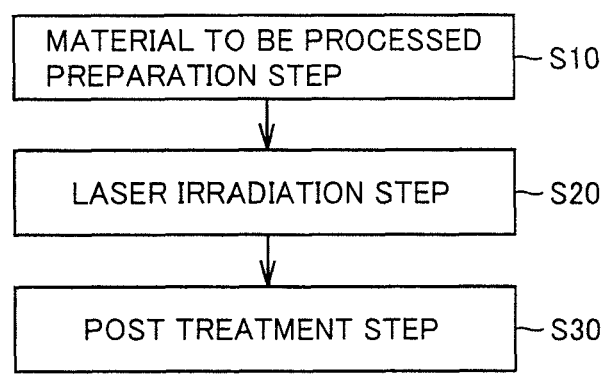
FIG. 1 is a flowchart showing a laser processing method according to the present invention.

An embodiment of the present invention will be described hereinafter with reference to the drawings, in which the same reference numerals are allotted to the same or corresponding portions and description thereof will not be repeated.

A laser processing method according to the present invention will be described with reference to FIG. 1.

In the laser processing method according to the present invention, a material to be processed preparation step (S10) is first performed. Specifically, a semiconductor substrate or other members (e.g., sapphire substrate) serving as a material to be processed that is subjected to laser processing is arranged at a predetermined position. For example, the material to be processed is fixed on an X-Y stage movable in the direction of an X-Y plane.

Next, a laser irradiation step (S20) is performed. In this step (S20), laser beam obtained from an MOPA laser light source 1 shown in FIG. 2, which serves as a laser light source according to the present invention, is focused using a lens having a predetermined focal length, and the material to be processed is irradiated with the focused laser beam. An MOPA (Master Oscillator Power Amplifier) structure amplifying laser beam obtained from a seed laser light source 10 at an optical fiber amplifying unit is used as MOPA laser light source 1 shown in FIG. 2. A more detailed configuration of MOPA laser light source 1 shown in FIG. 2 will be described below.

Figure 2:
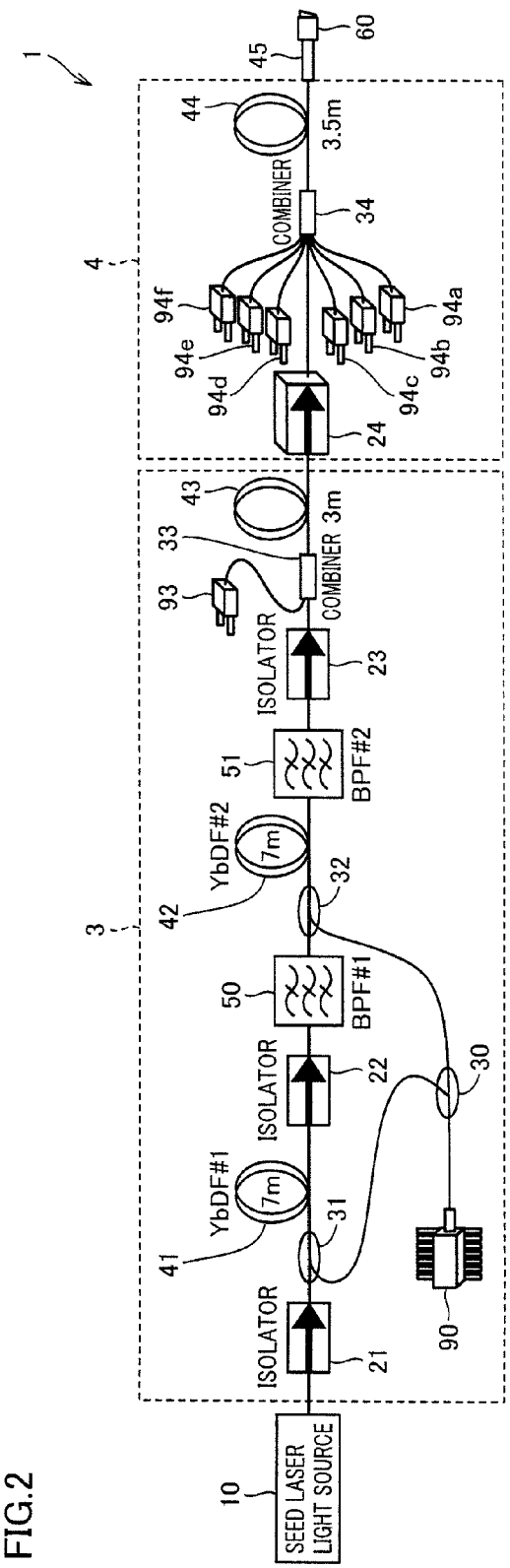
FIG. 2 is a schematic view showing an MOPA laser light source used in the laser processing method according to the present invention.

The laser beam obtained from MOPA laser light source 1 shown in FIG. 2 is a laser beam including wavelength components in a predetermined range (having a continuous spectrum) due to stimulated Raman scattering. When such laser beam having the continuous spectrum is focused with the lens, the focal position (focusing point) of the laser beam varies from wavelength component to wavelength component because the focal length varies from wavelength to wavelength of the laser beam. In other words, a focusing line, which is a collection of focusing points, is formed to extend linearly in the direction away from the lens (along the incidence direction of the laser beam). The material to be processed is irradiated with the laser beam such that this focusing line intersects the inside of the material to be processed or the surface of the material to be processed, or this focusing line is formed outside the material to be processed, and thereby a modified area can be formed in the material to be processed.

Then, the material to be processed is relatively moved with respect to the laser beam, and thereby a strip-shaped modified area having a certain depth and width can be foamed in, for example, an area of the material to be processed in which the focusing line has moved. In the material to be processed having the aforementioned modified area formed therein, a damaged portion such as a melt layer caused by irradiation with the laser beam is hardly formed on the surface irradiated with the laser beam, and a relatively good surface state can be kept. It is to be noted that a step of forming this strip-shaped modified area will be described below more specifically.

Next, a post treatment step (S30) shown in FIG. 1 is performed. Specifically, stress is applied to the material to be processed, and thereby the material to be processed can be divided, using the portion having the strip-shaped modified area formed therein as an origination area. It is to be noted that any conventionally well-known method can be used as a method for applying stress.

In the material to be processed having the aforementioned modified area formed therein, large projections and depressions or the like are not particularly formed on an end face obtained as a result of division, either, and good surface property can be kept.

Next, more specific description will be given to the laser irradiation step (S20) shown in FIG. 1. The laser beam used in the above step (S20) is supplied from MOPA laser light source 1 shown in FIG. 2. MOPA laser light source 1 according to the present invention shown in FIG. 2 includes seed laser light source 10, optical isolators 21 to 24, an optical coupler 30, WDM filters 31 and 32, optical combiners 33 and 34, amplifying optical fibers 41 to 44, a passive optical fiber 45, bandpass filters 50 and 51, an end cap 60, and pumping light sources 90, 93 and 94a to 94f. It is to be noted that seed laser light source 10 and pumping light sources 90, 93 and 94a to 94f are controlled by a not-shown control unit.

Optical isolator 21 is connected to the output side of seed laser light source 10 via an optical fiber. WDM filter 31 is connected to the output side of optical isolator 21 via the optical fiber. Pumping light source 90 is connected to the input side of WDM filter 31 via optical coupler 30 and the optical fiber. Amplifying optical fiber 41 is connected to the output side of WDM filter 31. Optical isolator 22 is connected to the output side of amplifying optical fiber 41. Bandpass filter 50 is connected to the output side of optical isolator 22.

WDM filter 32 is connected to the output side of bandpass filter 50. Pumping light source 90 is connected to the input side of WDM filter 32 via the optical fiber and optical coupler 30. Amplifying optical fiber 42 is connected to the output side of WDM filter 32. Bandpass filter 51 is connected to the output side of amplifying optical fiber 42. Optical isolator 23 is connected to the output side of bandpass filter 51. Optical combiner 33 is connected to the output side of optical isolator 23. Pumping light source 93 is connected to the input side of optical combiner 33 via the optical fiber. Amplifying optical fiber 43 is connected to the output side of optical combiner 33.

Optical isolator 24 is connected to the output side of amplifying optical fiber 43. Optical combiner 34 is connected to the output side of optical isolator 24. Pumping light sources 94a to 94f are connected to the input side of optical combiner 34 via the optical fiber. Amplifying optical fiber 44 is connected to the output side of optical combiner 34. Passive optical fiber 45 is connected to the output side of amplifying optical fiber 44. End cap 60 is connected to the output side of passive optical fiber 45.

It is to be noted that a portion from optical isolator 21 to amplifying optical fiber 43 constitutes a preamplifier unit 3, and a portion from optical isolator 24 to amplifying optical fiber 44 constitutes a booster amplifier unit 4.

Seed laser light source 10 generates pulsed laser having a fundamental wave. Seed laser light source 10 is implemented by, for example, a semiconductor laser. For example, in MOPA laser light source 1 used in the present invention, a 1060 nm Fabry-Perot semiconductor laser whose pulse is directly modulated in the range of 0 mA or more and 200 mA or less can be used as seed laser light source 10 in order to achieve a high pulse repetition rate of, for example, 100 kHz or more and 1 MHz or less and a fixed pulse width without dependence on the pulse repetition rate. Seed laser light source 10 may selectively output one of pulsed laser and CW laser. For example, seed laser light source 10 may be configured to be capable of selectively outputting one of pulsed laser and CW (Continuous Wave) laser in accordance with a control signal provided from the not-shown control unit.

Each of optical isolators 21 to 24 allows light to pass therethrough in the forward direction and interrupts light heading in the opposite direction. Each of amplifying optical fibers 41 to 44 is an optical fiber to which a rare-earth element is doped. Excitation light outputted from any one of pumping light sources 90, 93 and 94a to 94f is supplied via any one of optical coupler 30, WDM filters 31 and 32, and optical combiners 33 and 34, and this excitation light excites the rare-earth element. As a result, each of amplifying optical fibers 41 to 44 can amplify light having a wavelength of the fundamental wave. Each of pumping light sources 90, 93 and 94a to 94f may be implemented by, for example, a semiconductor laser.

Bandpass filter 50 selectively allows the light having a wavelength of the fundamental wave, of the light outputted from amplifying optical fiber 41, to pass therethrough and outputs the light. Bandpass filter 51 also selectively allows the light having a wavelength of the fundamental wave, of the light outputted from amplifying optical fiber 42, to pass therethrough and outputs the light. Passive optical fiber 45 receives the light having the fundamental wave, which was outputted from amplifying optical fiber 44, and propagates the light. During this propagation of the fundamental wave, passive optical fiber 45 causes stimulated Raman scattering. End cap 60 is provided at the tip of passive optical fiber 45 to emit the light outside from passive optical fiber 45.

This MOPA laser light source 1 operates as follows. The excitation light outputted from pumping light source 90 is divided into two by optical coupler 30, and one of the divided two excitation lights is supplied to amplifying optical fiber 41 via WDM filter 31. On the other hand, the other excitation light is supplied to amplifying optical fiber 42 via WDM filter 32. The excitation light outputted from pumping light source 93 is supplied to amplifying optical fiber 43 via optical combiner 33. The excitation light outputted from each of pumping light sources 94a to 94f is supplied to amplifying optical fiber 44 via optical combiner 34.

The light having the fundamental wave, which was outputted from seed laser light source 10, is inputted via optical isolator 21 and WDM filter 31 to amplifying optical fiber 41, where the light is amplified. The light having the fundamental wave, which was amplified in and outputted from amplifying optical fiber 41, is inputted via optical isolator 22, bandpass filter 50 and WDM filter 32 to amplifying optical fiber 42, where the light is amplified.

The light having the fundamental wave, which was amplified in and outputted from amplifying optical fiber 42, is inputted via bandpass filter 51, optical isolator 23 and optical combiner 33 to amplifying optical fiber 43, where the light is amplified. The light having the fundamental wave, which was amplified in and outputted from amplifying optical fiber 43, is inputted via optical isolator 24 and optical combiner 34 to amplifying optical fiber 44, where the light is amplified.

The light having the fundamental wave, which was amplified in four amplifying optical fibers 41 to 44, is inputted to one end of passive optical fiber 45 and propagates through passive optical fiber 45. In passive optical fiber 45, stimulated Raman scattering is caused during propagation of the fundamental wave. The light having the fundamental wave and the light having a stimulated Raman scattering component are outputted from the other end of passive optical fiber 45.

It is desirable that passive optical fiber 45 should have a core diameter and an NA of a core equal to those of amplifying optical fiber 44. This is because, if these fibers are different in dimension and property, a fusion loss occurs at a portion connecting amplifying optical fiber 44 and passive optical fiber 45, which may lead to optical damage.

In this MOPA laser light source 1, seed laser light source 10, for example, outputs light having a center wavelength of 1060 nm as the fundamental wave as described above. In addition, each of amplifying optical fibers 41 to 44 is preferably an optical fiber to which an Yb element is doped (YbDF). Each of these amplifying optical fibers 41 to 44 can have a core diameter of, for example, 10 µm, which facilitates fusion splicing and storage.

It is to be noted that the YbDF has such advantages that the excitation wavelength is close to the wavelength of amplified light and heat generation inside the YbDF is suppressed. Therefore, the YbDF is suitable as an industrial laser light source.

First-stage amplifying optical fiber 41 is a single-cladded Al-codoped quartz-based YbDF and has an Al concentration of 5 wt %, a core diameter of 10 µm and a clad diameter of 125 µm. In addition, non-saturated absorption in excitation light having a center wavelength of 915 nm is 70 dB/m, and a non-saturated absorption peak in excitation light having a center wavelength of 975 nm is 240 dB/m. First-stage amplifying optical fiber 41 has a length of 7 m.

Second-stage amplifying optical fiber 42 is a single-cladded Al-codoped quartz-based YbDF and has an Al concentration of 5 wt %, a core diameter of 10 µm and a clad diameter of 125 µm. In addition, non-saturated absorption in excitation light having a center wavelength of 915 nm is 70 dB/m, and a non-saturated absorption peak in excitation light having a center wavelength of 975 nm is 240 dB/m. Second-stage amplifying optical fiber 42 has a length of 7 m.

Third-stage amplifying optical fiber 43 is a double-cladded phosphate glass-based YbDF and has a P concentration of 26.4 wt %, an Al concentration of 0.8 wt %, a core diameter of 10 µm, and a first clad diameter of approximately 125 µm. The first clad has an octagonal cross-sectional shape. Furthermore, non-saturated absorption in excitation light having a center wavelength of 915 nm is 1.8 dB/m. Third-stage amplifying optical fiber 43 has a length of 3 m.

Fourth-stage amplifying optical fiber 44 is a double-cladded Al-codoped quartz-based YbDF and has an Al concentration of 1.5 wt %, a core diameter of 10 µm and a clad diameter of 128 µm. In addition, non-saturated absorption in excitation light having a center wavelength of 915 nm is 80 dB/m. Fourth-stage amplifying optical fiber 44 has a length of 3.5 m.

The excitation light outputted from each of pumping light sources 90, 93 and 94a to 94f has a center wavelength of 0.975 p.m. Excitation power introduced from pumping light source 90 to amplifying optical fibers 41 and 42 is 200 mW (single mode). Excitation power introduced from pumping light source 93 to amplifying optical fiber 43 is 2 W (multimode). Total excitation power introduced from pumping light sources 94a to 94f to amplifying optical fiber 44 is 25 W. An output fiber of pumping light source 90 has a core diameter of 6 µm and an NA of 0.14. An output fiber of each of pumping light sources 93 and 94a to 94f has a core diameter of 105 µm and an NA of 0.22.

In a solid-state laser such as a YAG laser and a $YVO_4$ laser, a high gain up to tens of decibels cannot be obtained. Therefore, optical fiber amplification having a multistage amplification configuration as shown in FIG. 2 is suitable in order to obtain a high gain. It is pointed out that the fiber laser as shown in FIG. 2 has a limitation in pulse peak power because of the nonlinear effect (e.g., stimulated Raman scattering: SRS and the like) in the optical fiber.

Figure 3:
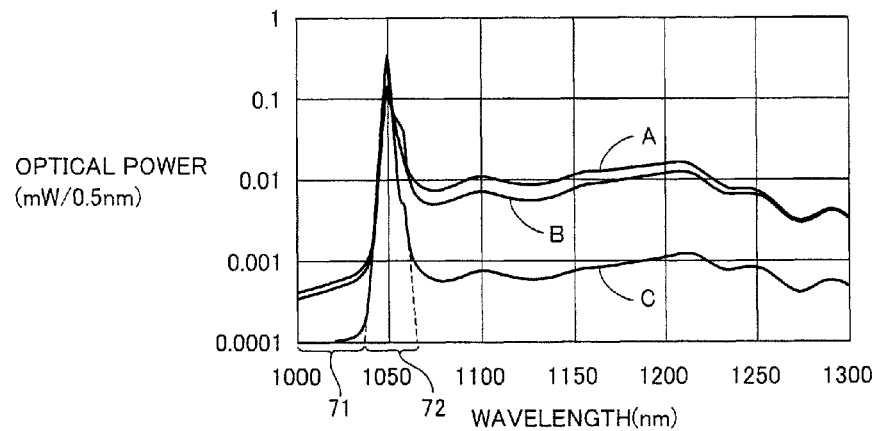
FIG. 3 is a graph showing a spectrum of pulsed laser light outputted from the MOPA laser light source shown in FIG. 2.

FIG. 3 shows a spectrum of pulsed laser light (optical pulse output) having a pulse repetition rate of 1 MHz, a pulse width of 130 ps, and a pulse peak power at the fiber emission end of 50 kW or more, which is implemented by MOPA laser light source 1 shown in FIG. 2. In FIG. 3, the horizontal axis indicates wavelength of the pulsed laser light and the vertical axis indicates optical power (optical output). The wavelength in the horizontal axis is expressed in the unit nm and the optical power in the vertical axis is expressed in the unit mW/0.5 nm. It is to be noted that FIG. 3 shows spectra of three types of pulsed laser lights having different proportions of SRS components.

As can be seen from FIG. 3, in the pulsed laser light obtained from MOPA laser light source 1 shown in FIG. 2, stimulated Raman scattering (SRS) is remarkable, and the wavelength of the laser light is distributed over a wide range of the wavelength region from the wavelength of 1050 nm, which is the fundamental wavelength, to the wavelength of 1219 nm, which is considered to be the wavelength of a third-order SRS component of the light having the fundamental wavelength, and the laser light exhibits a continuous spectrum. It is to be noted that an area indicated by a wavelength area 72 in FIG. 3 is a maximum peak spectral range that is an area including a wavelength exhibiting a maximum value of the optical output, and an area indicated by a wavelength area 71 shows a spectrum of an ASE (Amplified Spontaneous Emission) component.

Figure 4:
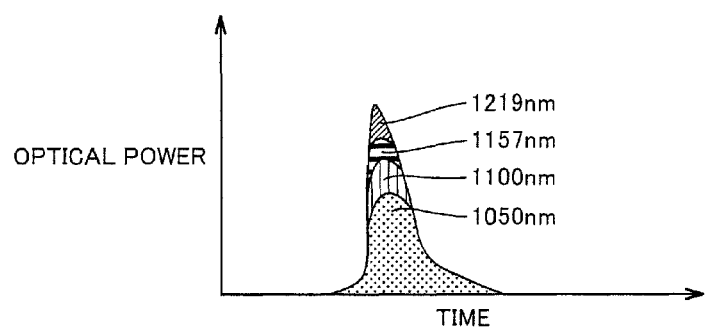
FIG. 4 is a graph schematically showing a time change in intensity of wavelength components included in the pulsed laser light outputted from the MOPA laser light source shown in FIG. 2.

Since the aforementioned SRS components are generated almost synchronously with the fundamental wave component having a wavelength of 1050 nm as shown in FIG. 4, the effect of widening the pulse width is small. In FIG. 4, the horizontal axis indicates time and the vertical axis indicates optical power. FIG. 4 schematically shows a time course of optical power output of the fundamental wave component and the SRS components in the aforementioned pulsed laser light.

Figure 5:
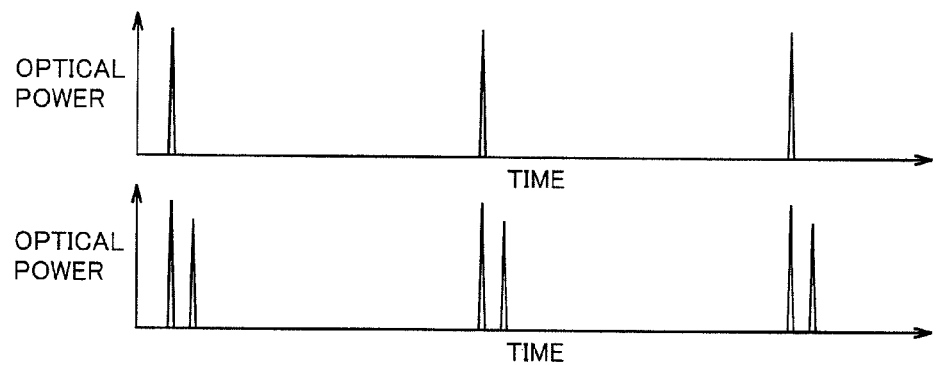
FIG. 5 is a graph schematically showing the case where a plurality of pulses oscillate periodically (multi-pulsing) and the case where a single pulse oscillates.

The optical power of the SRS components in the aforementioned pulsed laser light (optical pulse output) can be controlled by appropriately adjusting conditions such as the average output power, the pulse width and the pulse repetition rate of the pulsed laser light obtained from MOPA laser light source 1 shown in FIG. 2. This optical power of the SRS components can also be controlled by employing a special waveform such as a multipulsed waveform of pulsed laser light entering from seed laser light source 10 as shown in the lower graph in FIG. 5. FIG. 5 is a schematic view for describing a pattern of a pulse generated at the seed laser light source, in which the horizontal axis indicates time and the vertical axis indicates optical power of the pulse. In FIG. 5, two graphs are shown vertically. The upper graph shows periodical generation of one pulse. On the other hand, the lower graph schematically shows a waveform of so-called multipulsed pulsed laser, where two pulses are generated periodically and continuously.

The power of the SRS components can also be adjusted to a certain extent by changing the length of a delivery fiber (passive optical fiber 45) extending from fourth-stage (last-stage) amplifying optical fiber 44 to end cap 60 shown in FIG. 2.

The ratio between the power of the fundamental wave and the power of a sum total of the SRS components for each of graphs A to C shown in FIG. 3 is as follows. Specifically, under a condition indicated by graph A, the ratio between the power of the fundamental wave and the power of the sum of the SRS components is 2:1. Under a condition indicated by graph B, the ratio between the power of the fundamental wave and the power of the sum of the SRS components is 1:1. Under a condition indicated by graph C, the ratio between the power of the fundamental wave and the power of the sum of the SRS components is 10:1.

The aforementioned condition indicated by graph A corresponds to a condition that an average power of laser beam reaching the material to be processed is set to 8 W, a pulse repetition rate thereof is set to 1 MHz and a pulse width thereof is set to 200 ps. The condition indicated by graph B in FIG. 3 corresponds to a condition that only the pulse width is decreased to 130 ps as compared with the above condition indicated by graph A. The condition indicated by graph C in FIG. 3 corresponds to a condition that the pulse repetition rate is decreased to 100 kHz as compared with the condition indicated by graph A and the pulse width is decreased to 130 ps similarly to the condition indicated by graph B.

Figure 6:
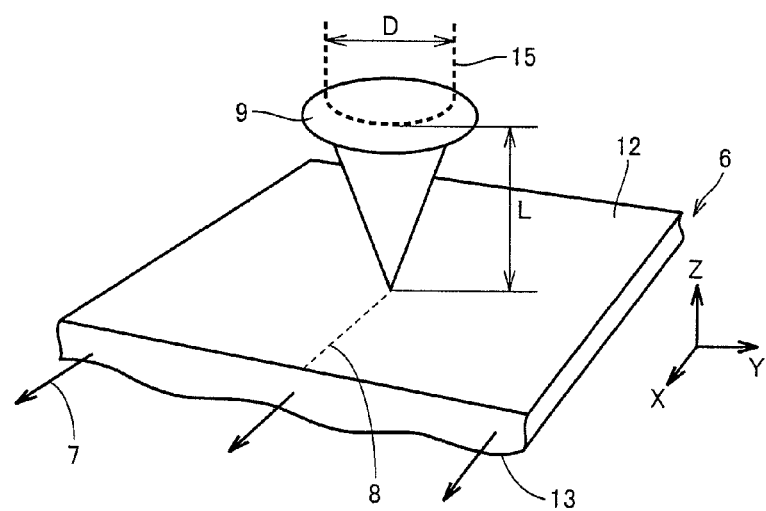
FIG. 6 is a schematic perspective view showing an optical system irradiating a material to be processed with laser beam.

In the laser irradiation step (S20) shown in FIG. 1, laser beam emitted from end cap 60 in FIG. 2 is focused by a lens 9 arranged to face a material to be processed 6 as shown in FIG. 6 by a predetermined optical system, and material to be processed 6 is irradiated with the focused laser beam. In the experimental system shown in FIG. 6, output light of almost diffraction-limited beam quality obtained from MOPA laser light source 1 shown in FIG. 2 is, for example, collimated to enlarge a beam diameter D to 5 mm, and thereafter, the light is focused by lens 9 shown in FIG. 6. A lens having a focal length of, for example, 20 mm can be used as lens 9. A sapphire substrate having a thickness of, for example, 400 μm can be used as material to be processed 6. A surface of material to be processed 6 which laser beam 15 enters may be, for example, a glossy surface 12 (mirror-finished surface). It is to be noted that a distance L between lens 9 and glossy surface 12 of material to be processed 6 is appropriately adjusted. By moving material to be processed 6 in the direction indicated by an arrow 7 in FIG. 6 (i.e., moving material to be processed 6 in the X-axis direction in FIG. 6), an area 8 of material to be processed 6 irradiated with laser beam 15 can be linearly formed. The moving speed of material to be processed 6 at this time can be set to, for example, 10 mm/s or more and 40 mm/s or less. It is to be noted that the lower surface of material to be processed 6 may be a satin-finished surface 13 (non-mirror-finished surface or non-glossy finished surface).

Figure 7:
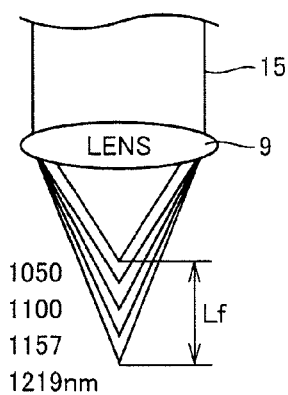
FIG. 7 is a schematic view for describing a focal position of each wavelength component included in the laser beam according to the present invention.

As shown in FIG. 7, as for the laser beam having a wavelength of 1050 nm, the position of the focusing point (focal position) by lens 9 is expected to be located at a distance of 20 mm from lens 9. On the other hand, as shown in FIG. 7, each of the SRS components included in the laser beam has a wavelength larger than aforementioned 1050 nm, and thus, the focusing point is considered to be formed (to be focused) at a position farther from the focusing point located at the distance of 20 mm from the lens. It is to be noted that the focal length generally tends to become longer as the wavelength of focused light becomes longer. Therefore, the pulsed laser beam including the SRS components does not form a single focusing point as in the conventional art even if the pulsed laser beam is focused by lens 9, but forms a so-called focusing line in which the focusing points are distributed continuously in the optical axis direction as viewed from lens 9. Specifically, as shown in FIG. 7, the focusing line having at least a length indicated by a length Lf is formed.

Figure 8:
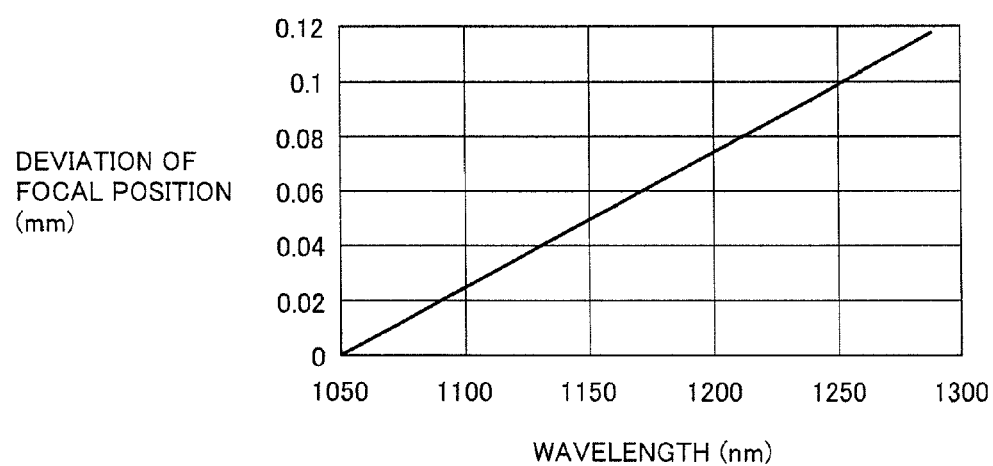
FIG. 8 is a graph showing a relationship between wavelength and deviation of focal position about each wavelength component shown in FIG. 7.

Specifically, when the lens having a focal length of 20 mm is used as lens 9 in the experimental system shown in FIG. 6 and the pulsed laser beam having beam diameter D of 5 mm is focused inside material to be processed 6 that is the sapphire substrate, a relationship between wavelength and position of focusing point (focus) of the laser beam attains a relationship shown in FIG. 8. In FIG. 8, the horizontal axis indicates the wavelength of the laser light and the vertical axis indicates, as deviation of the focal position, a distance from the focal position of the laser light having a wavelength of 1050 nm to the focal position of the laser light having each wavelength. The wavelength in the horizontal axis is expressed in the unit nm and the deviation in the vertical axis is expressed in the unit mm. As described above, it can be seen that the focal position moves farther away from the lens as the wavelength becomes longer.

As for the laser light having a wavelength range from 1050 nm, which is the wavelength of the fundamental wave, to 1219 nm, which is the peak wavelength of the third-order SRS component as shown in FIG. 7, length Lf of the focusing line in the aforementioned system can be estimated at about 84 μm. Furthermore, the peak wavelength of a fourth-order SRS component is 1288 nm, and if this fourth-order SRS component is also taken into consideration, the length of the focusing line can be estimated at about 118 μm.

Power distribution of the SRS components fluctuates moderately but constantly due to a state of a polarized wave in the optical fiber, a bending loss of the optical fiber, and the like. Therefore, there is a possibility that the shape of spectral distribution shown in FIG. 3 also exhibits a certain level of time fluctuations.

When the material to be processed is irradiated with such laser beam that forms the focusing line having a predetermined length, a modified area recognized as a broken portion or a crack can be formed near the lower surface (surface opposite to the side irradiated with the laser beam) of the material to be processed, by appropriately adjusting a relative relationship between the position of the focusing line and the position of the material to be processed. Using such a modified area as an origination area, material to be processed 6 can be readily divided in the post treatment step (S30) as described above.

The positional relationship between the position of the focusing line of the focused laser beam and material to be processed 6 may be such that the position of the focusing point of the fundamental wave (wavelength component having a wavelength of 1050 nm) of the laser beam matches the surface (glossy surface 12) of material to be processed 6 as shown in FIG. 6 (i.e., the focusing line of the laser beam may be arranged to extend from the surface side to the inside of material to be processed 6). Alternatively, the positional relationship may be different positional relationships as shown in FIGS. 9 to 11.

Figure 9:
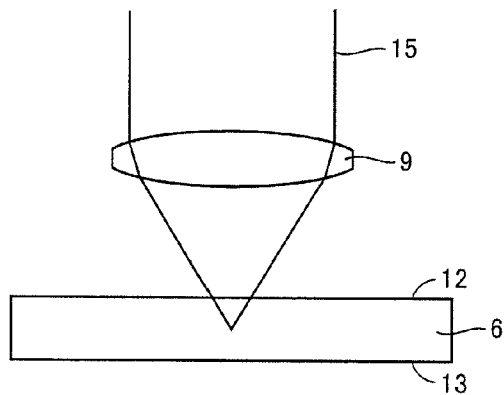
FIG. 9 is a schematic view showing one example of a positional relationship between the focused laser beam and the material to be processed.

For example, as shown in FIG. 9, the focusing point of the fundamental wave of laser beam 15 may be arranged inside material to be processed 6 in the thickness direction thereof. From a different perspective, the focusing point of the fundamental wave of laser beam 15 may be arranged between the surface (glossy surface 12) and the lower surface (satin-finished surface 13) of material to be processed 6. In this case, the focusing line of the laser beam may intersect the lower surface (satin-finished surface 13) of material to be processed 6, or the entire focusing line may be arranged between glossy surface 12 and satin-finished surface 13.

Figure 10:
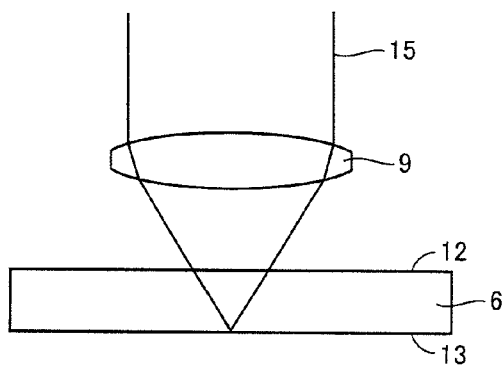
FIG. 10 is a schematic view showing one example of a positional relationship between the focused laser beam and the material to be processed.
Figure 11:
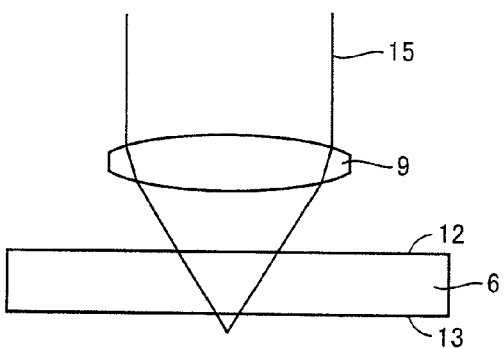
FIG. 11 is a schematic view showing one example of a positional relationship between the focused laser beam and the material to be processed.

As a different manner, as shown in FIG. 10, the focusing point of the fundamental wave of laser beam 15 may be arranged at a position overlapping with the lower surface (satin-finished surface 13) of material to be processed 6. In this case, the focusing line of the laser beam is arranged to extend from the lower surface (satin-finished surface 13) to the outside of material to be processed 6. As a further different manner, as shown in FIG. 11, the focusing point of the fundamental wave of laser beam 15 may be arranged outside the lower surface (satin-finished surface 13) of material to be processed 6. In this case, the focusing line of the laser beam is also arranged outside the lower surface (satin-finished surface 13) of material to be processed 6.

Next, a mechanism of formation of the modified area inside the sapphire substrate will be discussed.

FIGS. 12 to 16 are schematic views for describing the focusing feature of laser beam to form the modified area inside the sapphire substrate.

Figure 12:
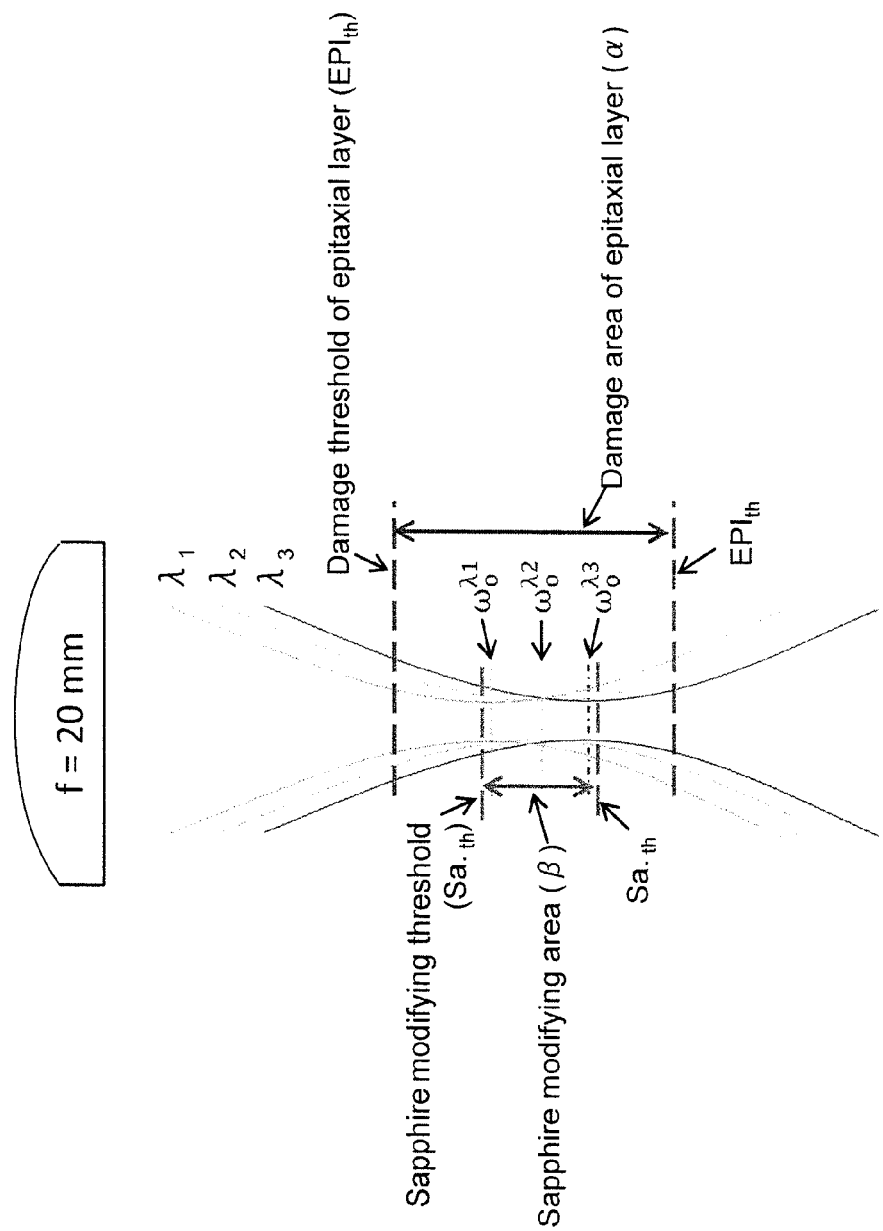
FIG. 12 is a schematic view for describing a focusing feature of laser beam to form a modified area inside the sapphire substrate.

The epitaxial layer made of GaN and the sapphire substrate have different damage thresholds (threshold value at which damage is caused by irradiation with laser beam having a power density that is equal to or higher than a certain power density). Generally, the damage threshold of the epitaxial layer is lower than that of the sapphire substrate. FIG. 12 is a schematic view of a portion near the focusing point considering the damage thresholds of the epitaxial layer and the sapphire substrate. Since the laser light source used in the present invention has a wideband spectrum, there are focusing points corresponding to the respective wavelengths. The focusing points corresponding to wavelengths $\lambda_1$, $\lambda_2$ and $\lambda_3$ are indicated by $\omega_0^{\lambda_1}$, $\omega_0^{\lambda_2}$ and $\omega_0^{\lambda_3}$. When $EPI_{th}$ represents the damage threshold of the epitaxial layer and $Sa._{th}$ represents the damage threshold of the sapphire substrate, there is a relationship of $EPI_{th} < Sa._{th}$. As shown in FIG. 12, two $EPI_{th}$ and two $Sa._{th}$ exist at positions symmetrical in the upper-to-lower direction on beam propagation with respect to an area near the focusing points. An area between two $EPI_{th}$ is indicated by an epitaxial layer damage area α, and an area between two $Sa._{th}$ is indicated by a sapphire damage area β. Area α refers to a power density area where the epitaxial layer is damaged. Area β refers to an area where the sapphire substrate is damaged. It is to be noted that as for the shape of the lens used for focusing, a lens that is flat on the material to be processed side and is convex on the laser light source side as shown in FIG. 12 may be used. Alternatively, a lens having convex shapes on both sides as shown in FIG. 7 may be used. When such a lens that one surface is flat and the other surface is convex is used like the lens shown in FIG. 12, the lens may be arranged such that the flat surface is positioned on the laser light source side and the convex surface is positioned on the material to be processed side as described below.

Figure 13:
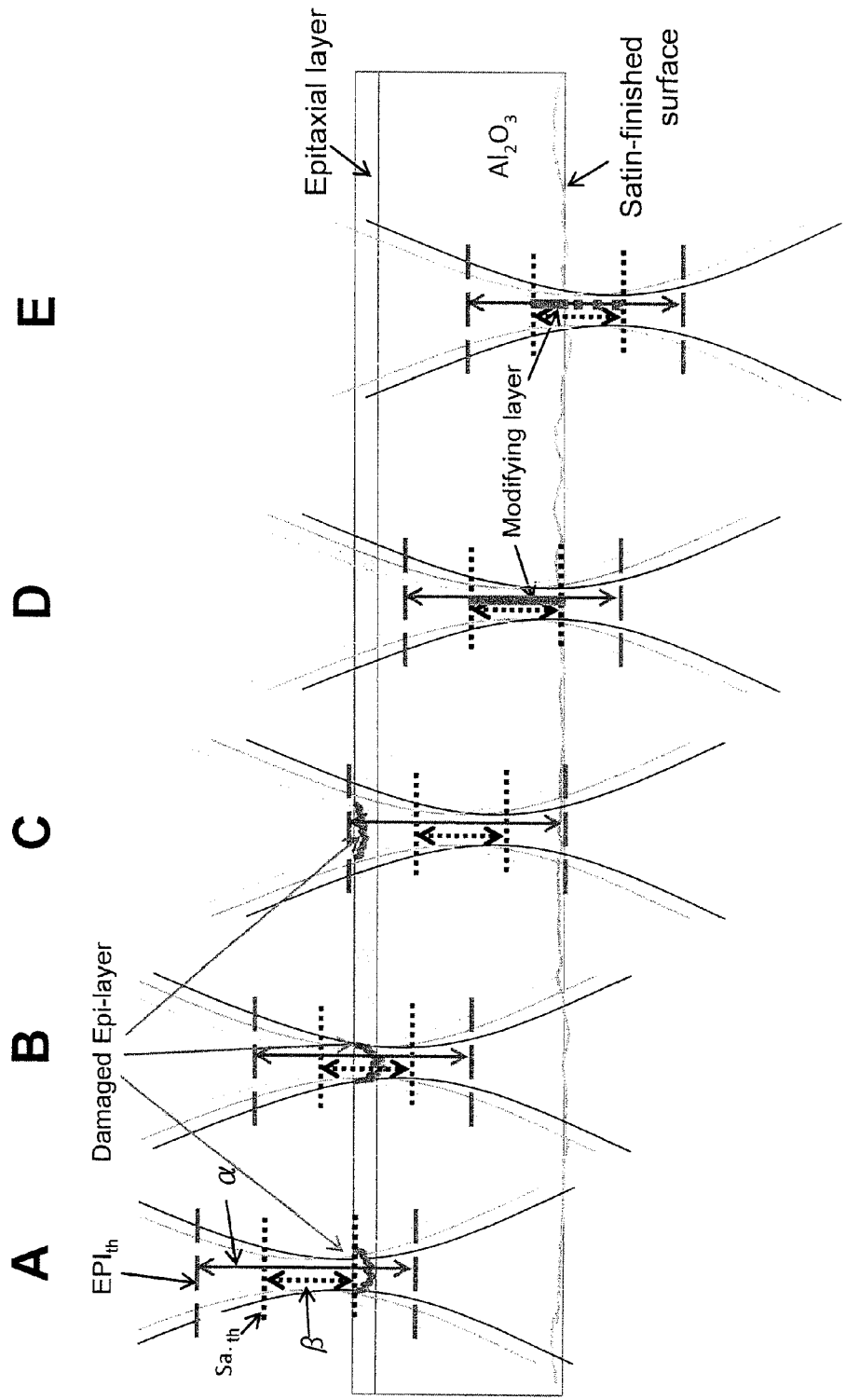
FIG. 13 is a schematic view for describing the focusing feature of laser beam to form the modified area inside the sapphire substrate.

A to E in FIG. 13 correspond to A to E in FIGS. 31 and 32 described below.

A: (When the focusing point is located at a position in the air that is 0.1 mm above the upper surface of the specimen) since the epitaxial layer of the specimen is located in area α, the epitaxial layer is damaged. Area β is located in the air.

B: (When the focusing point is located on the epitaxial layer) since the epitaxial layer is located in area α similarly to A, the epitaxial layer is damaged. Although a part of area β reaches the sapphire substrate, laser beam scatters due to the damaged epitaxial layer, and thus, optical power density in area β decreases significantly. Therefore, the modified area is not formed inside the sapphire substrate.

C: (When the focusing point is located inside the sapphire substrate that is 0.1 mm below the epitaxial layer) since the epitaxial layer is located in area α similarly to A and B, the epitaxial layer is damaged. Although area β is located inside the sapphire substrate, laser beam scatters due to the damaged epitaxial layer, and thus, the modified area is not formed inside the sapphire substrate similarly to B.

D: (When the focusing point is located inside the sapphire substrate that is 0.2 mm below the epitaxial layer) since the epitaxial layer is located outside area α, the epitaxial layer is not damaged. Area β is located inside the sapphire substrate. Since the epitaxial layer is not damaged, laser beam does not scatter and enters the sapphire substrate, and the modified area is formed in area β.

E: (When the focal position passes through the sapphire substrate and is located in the air) since the epitaxial layer is located outside area α, the epitaxial layer is not damaged similarly to D. A part of area β is located inside the sapphire substrate. Since the epitaxial layer is not damaged, incident light produces a high power density in area β similarly to D and the modified area is formed in area β.

Figure 14:
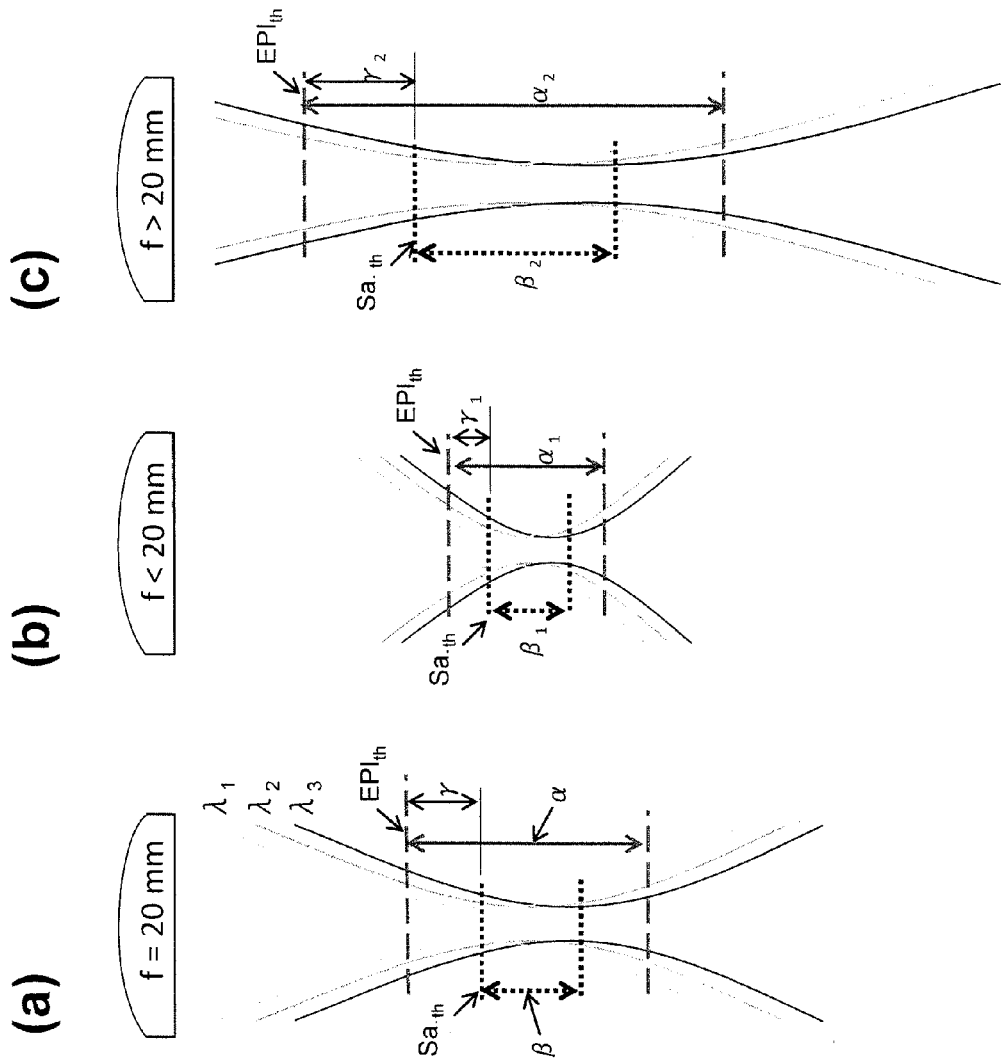
FIG. 14 is a schematic view for describing the focusing feature of laser beam to form the modified area inside the sapphire substrate.

FIG. 14 is a schematic view showing a relationship between $EPI_{th}$ and $Sa._{th}$ when different focusing lenses are used.

FIG. 14(a) is a schematic view when the lens of f=20 mm used in FIGS. 30 to 32 described below is used. Assume that $\gamma=(\alpha-\beta)/2$. In the following description, the length of area α in the depth direction may be simply indicated by "α" and the length of area β in the depth direction may be simply indicated by "β."

FIG. 14(b) is a schematic view when a lens of f<20 mm is used. Since values of $EPI_{th}$ and $Sa._{th}$ are material property values, the values are the same as those in FIG. 14(a). However, in each of area α and area β, a relative change occurs based on Gaussian beam propagation, and there are an area $\alpha_1$ and an area $\beta_1$ different from area α and area β in FIG. 14(a). Therefore, a value of $\gamma_1$ is $(\alpha_1-\beta_1)/2$. On the other hand, FIG. 14(c) is a schematic view when a lens of f>20 mm is used. There are a relatively-changed area $\alpha_2$ and a relatively-changed area $\beta_2$ similarly to FIG. 14(b), and a value of $\gamma_2$ is $(\alpha_2-\beta_2)/2$.

Figure 15:
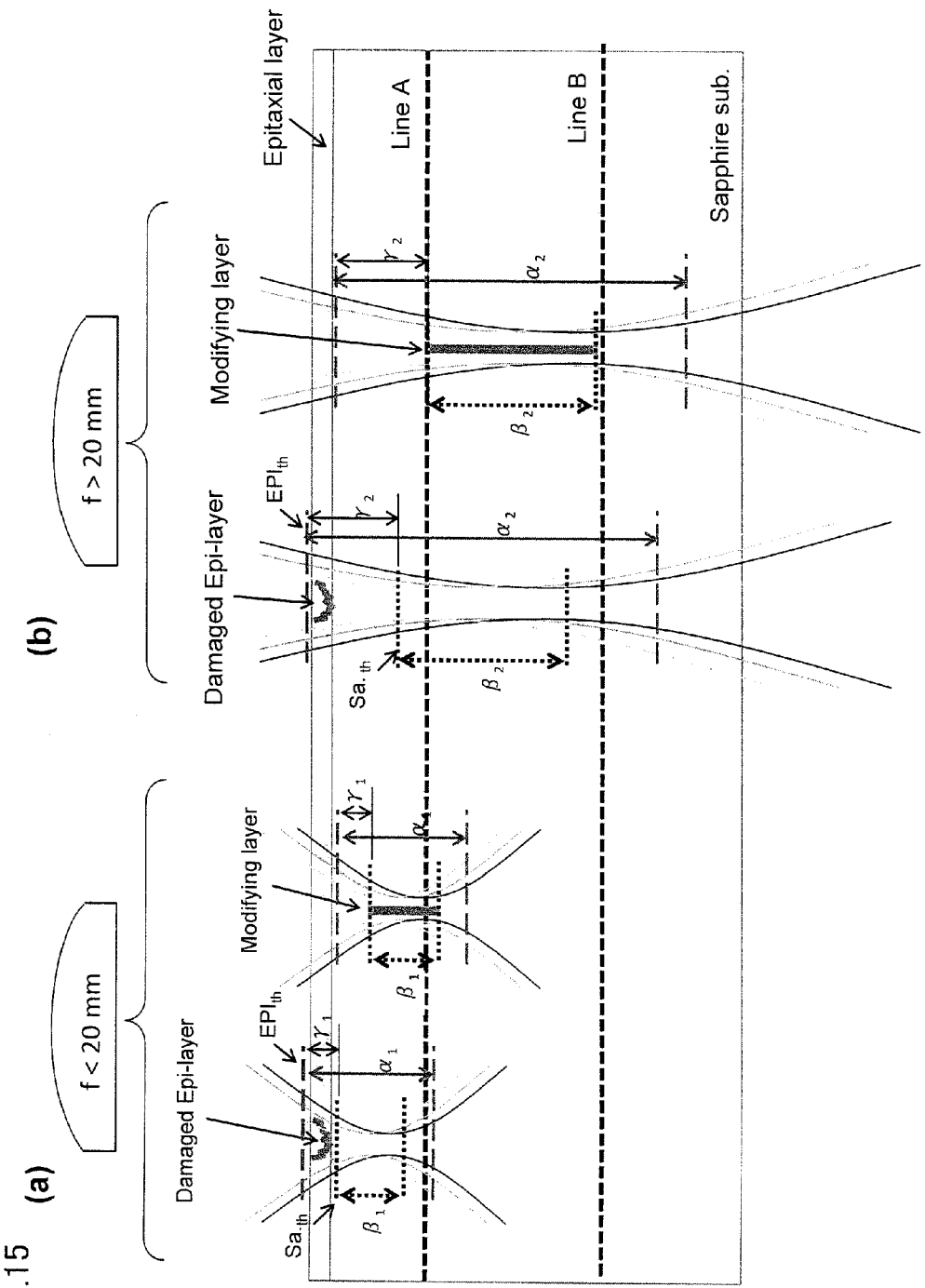
FIG. 15 is a schematic view for describing the focusing feature of laser beam to form the modified area inside the sapphire substrate.

FIG. 15 is a schematic view for describing a relationship between distance γ from the epitaxial layer to the internal modified area and the length of the internal modified area (length of area β) when different focusing lenses are used.

FIG. 15(a) shows a relationship between area $\beta_1$ and $\gamma_1$ when the focusing lens (f<20 mm) in FIG. 14(b) is used. FIG. 15(b) shows a relationship between area $\beta_2$ and $\gamma_2$ when the focusing lens (f>20 mm) in FIG. 14(c) is used. When the focal length is short, the value of $\gamma_1$ can be decreased. Therefore, the depth at which the modified area is formed can be brought closer to the epitaxial layer. However, the length of the modified area (length of area $\beta_1$) decreases. On the other hand, when the focal length is long, the value of $\gamma_2$ increases, and thus, the modified area is formed in an area farther from the epitaxial layer. However, the length of the modified area, which is the length of area $\beta_2$, increases. For example, when the substrate thickness is Line A (i.e., when the lower surface of the sapphire substrate is located at a position indicated by Line A), the modified area is not formed because area β is located outside the crystal in the case of the focusing lens of f>20 mm. Therefore, the focusing lens of f<20 mm must be used to form the modified area. On the other hand, when the substrate thickness is Line B (i.e., when the lower surface of the sapphire substrate is located at a position indicated by Line B), the internal modified area is formed in both cases of the lens of f<20 mm and the lens of f>20 mm. In some cases, however, it is advantageous to form the long modified area at a time, and in such a case, the lens of f>20 mm must be used.

As described above, as a guideline for forming a desired internal modified area having a desired substrate thickness, the values of $EPI_{th}$ and $Sa._{th}$ must be obtained, the relationship between γ0 and β0 must be made clear, and the focusing lens having an appropriate f value must be used as shown in FIG. 15.

Figure 16:
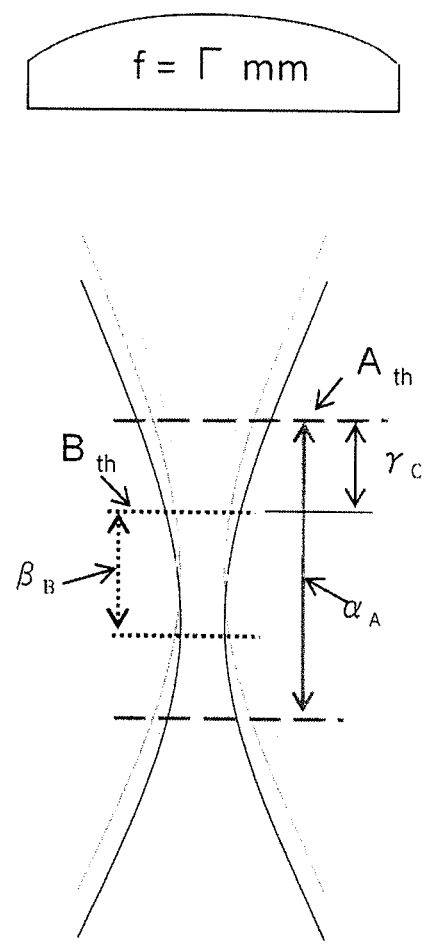
FIG. 16 is a schematic view for describing the focusing feature of laser beam to form the modified area inside the sapphire substrate.

FIG. 16 is a schematic view for describing conditions for forming the internal modified area. As shown in FIG. 16, in order to form the internal modified area with desired $\gamma_C$ and $\beta_B$ in a different material (thickness t) having a damage threshold $B_{th}$, a layer having a designed damage threshold $A_{th}$ must be deposited on the material and an appropriate optical lens (f=Γ mm) must be used.

Figure 17:
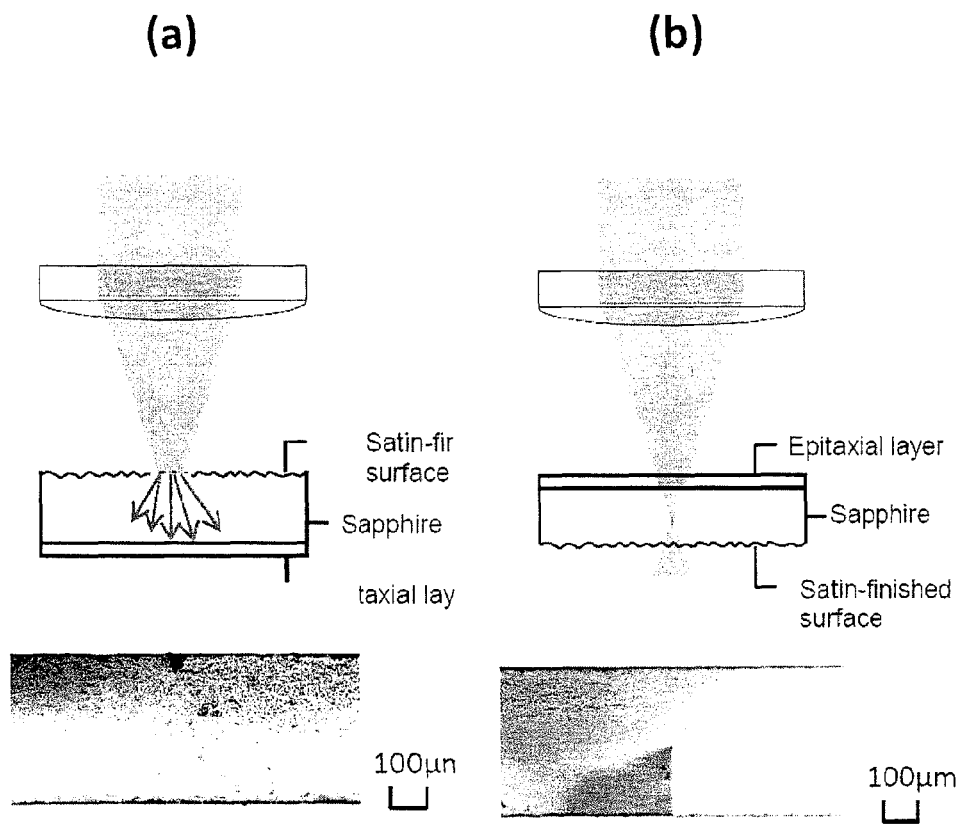
FIG. 17 is a schematic view for describing an influence caused by a state of an incidence plane when the laser beam enters the specimen.

FIG. 17 is a schematic view for describing an influence caused by a state of an incidence plane when laser beam enters the specimen. FIG. 17(a) shows a case where the specimen is irradiated with laser beam from the satin-finished surface of the specimen. On the other hand, FIG. 17(b) shows a case where the specimen is irradiated with laser beam from the surface of the specimen where the epitaxial layer is formed. As shown in FIG. 17, when the laser beam enters from the satin-finished surface, the laser beam scatters on the surface of the specimen, and thus, the modified area is not formed.

Figure 18:
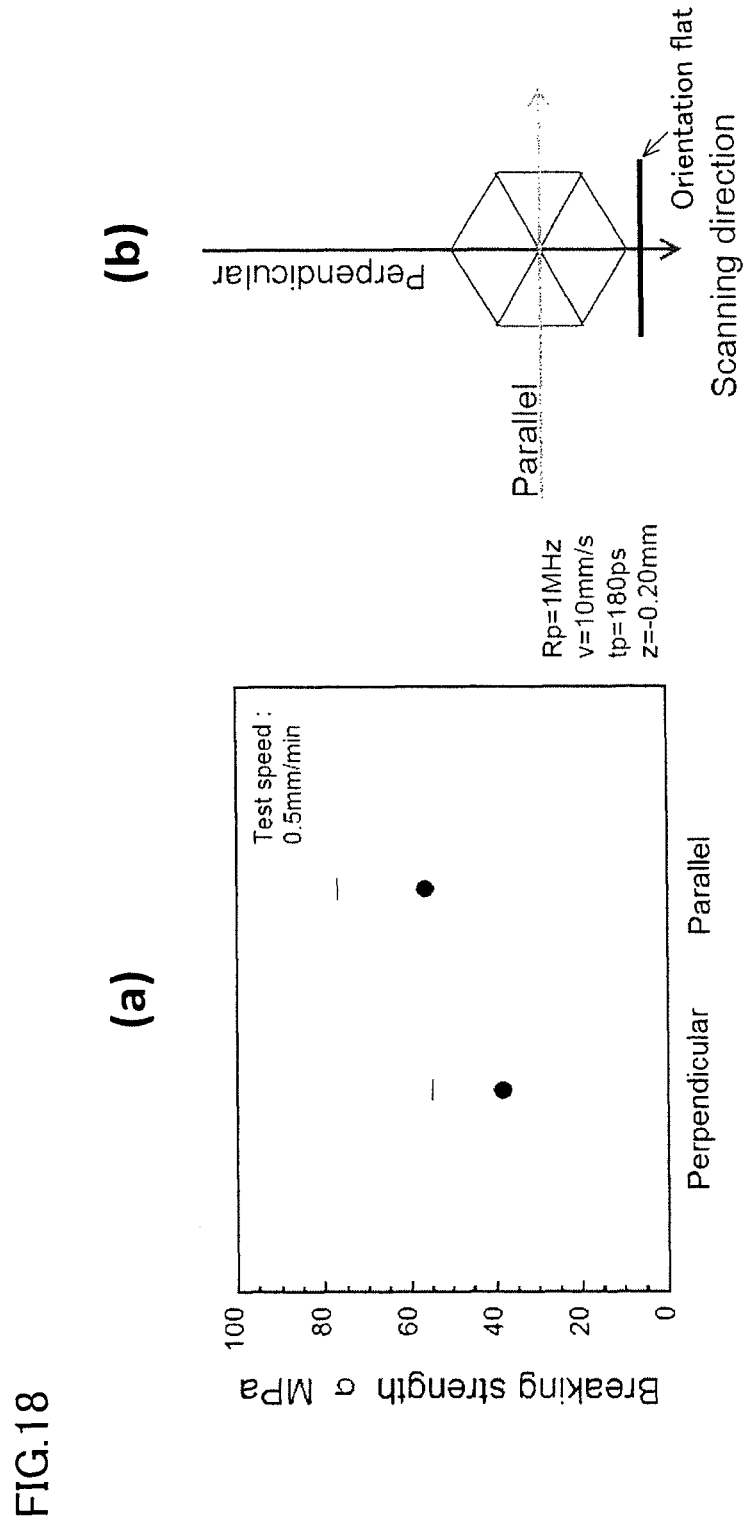
FIG. 18 is a schematic view for describing a relationship between laser beam scanning direction in the laser processing method according to the present invention and breaking strength of the specimen.

FIG. 18 is a schematic view for describing a relationship between laser scanning direction in the laser processing method according to the present invention and breaking strength of the specimen. FIG. 18(a) is a graph showing a relationship between laser scanning direction and breaking strength. FIG. 18(b) is a schematic view for describing a relationship between the laser scanning direction in FIG. 18(a) and crystal orientation of the sapphire substrate.

Referring to FIG. 18(a), the breaking strengths in the perpendicular direction and in the parallel direction are approximately 40 MPa and 60 MPa, respectively, and decrease to 1.7% and 2.6%, respectively, as compared with the tensile strength of the sapphire substrate of 2250 MPa. In addition, a difference between the breaking strengths in the horizontal direction and in the perpendicular direction is extremely small. As described above, the substrate can be divided along the laser beam scanning line regardless of the crystal orientation of the sapphire substrate. In other words, the substrate can be divided with small stress, using the internal modified area as an origination area.

Figure 19:
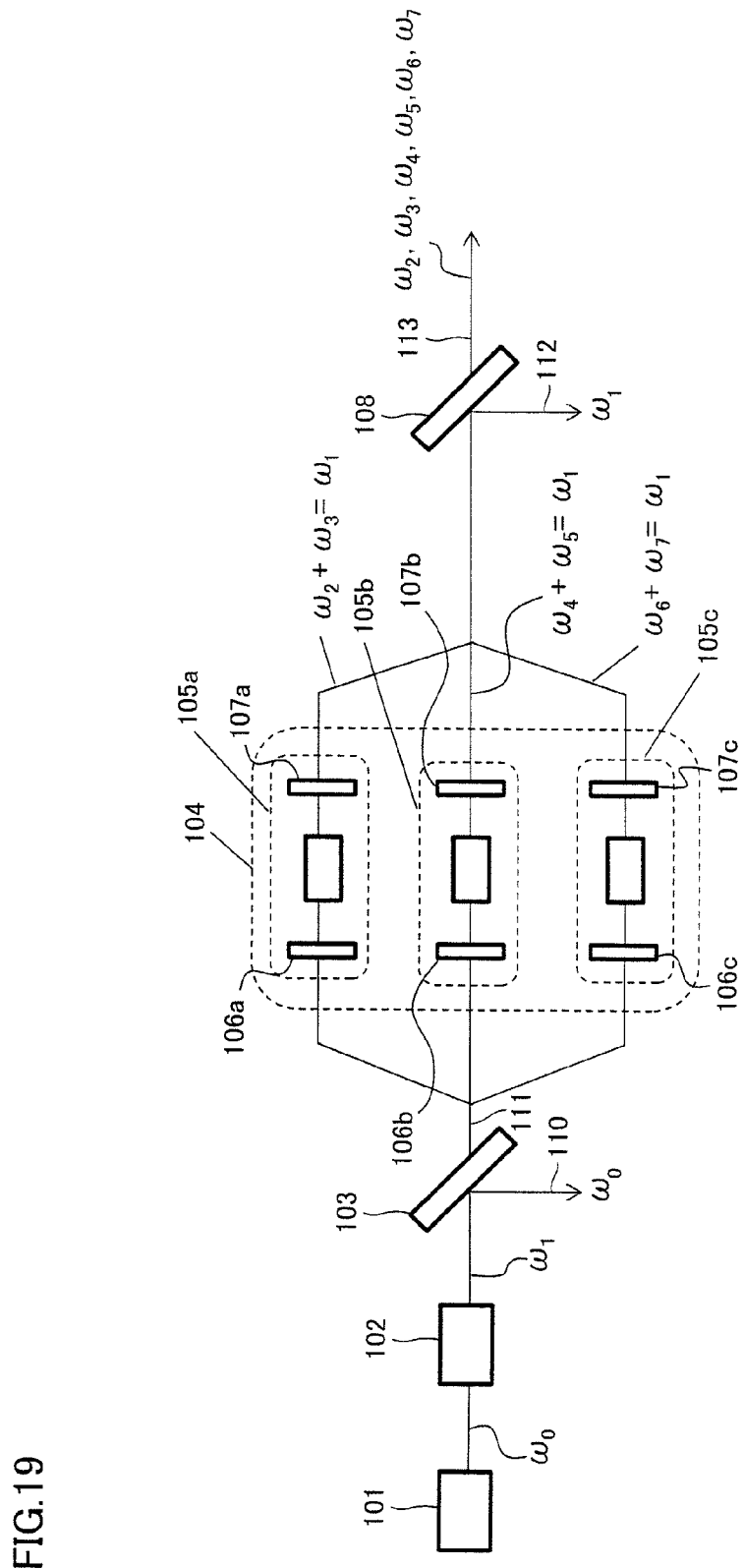
FIG. 19 is a schematic view for describing a configuration of an example of a discrete spectral laser light source.

Next, an example of a discrete spectral laser light source used in the present invention will be described with reference to FIG. 19. The laser light source shown in FIG. 19 is one example of seed laser light source 10 in FIG. 2, and a Ti:Sapphire laser or Nd:YAG laser light source having high peak power is used as a light emission unit 101. Assume that the wavelength of light emitted from light emission unit 101 is a wavelength $\omega_0$ (e.g., 1064 nm). At an SHG crystal 102, the emitted light is converted into light having a wavelength $\omega_1$ (e.g., 532 nm) of a double wave.

Next, a dichroic mirror 103 having a high reflection property for light having wavelength $\omega_0$ and a high transmission property for light having wavelength $\omega_1$ makes a separation between a component having wavelength $\omega_0$ and a component having wavelength $\omega_1$. The component having wavelength $\omega_0$, which was separated by dichroic mirror 103, is reflected in a direction shown by an arrow 110 in FIG. 19. On the other hand, the component having wavelength $\omega_1$ passes through dichroic mirror 103 as shown by an arrow 111.

Next, the component (light) having wavelength $\omega_1$ is divided equally into a plurality of optical paths by using several half mirrors. Each equally-divided light is converted by an OPO 104 (Optical Parametric Oscillator 104) into light having a different wavelength and satisfying the law of conservation of energy. For example, at an area 105a in OPO 104, the light having wavelength $\omega_1$ is converted into light having a wavelength $\omega_2$ and light having a wavelength $\omega_3$. In addition, at an area 105b in OPO 104, the light having wavelength $\omega_1$ is converted into light having a wavelength $\omega_4$ and light having a wavelength $\omega_5$. Furthermore, at an area 105c in OPO 104, the light having wavelength $\omega_1$ is converted into light having a wavelength $\omega_6$ and light having a wavelength $\omega_7$. In OPO 104, aforementioned wavelengths $\omega_2$ to $\omega_7$ are designed to be different from one another. Areas 105a to 105c in OPO 104 are arranged at the same distance from the half mirrors (not shown) placed on the output side of dichroic mirror 103.

Areas 105a to 105c in OPO 104 include mirrors 106a to 106c and mirrors 107a to 107c, respectively.

Figure 20:
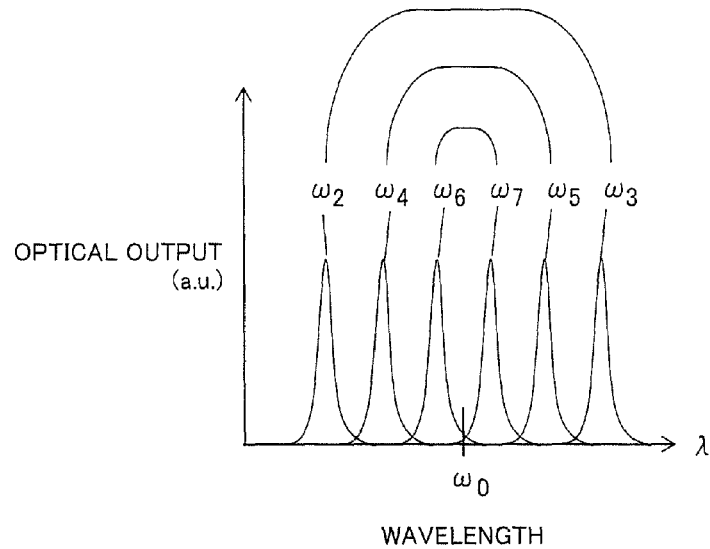
FIG. 20 is a schematic view showing an overview of a spectrum of light obtained from the discrete spectral laser light source shown in FIG. 19.

FIG. 20 shows an overview of a spectrum of the light having wavelengths $\omega_2$ to $\omega_7$ after wavelength conversion. Referring to FIG. 20, the horizontal axis indicates wavelength of light and the vertical axis indicates optical output (a.u.). As can be seen from FIG. 20, the wavelengths of the respective light after wavelength conversion are distributed, with wavelength $\omega_0$ being the center. In addition, as shown in FIGS. 19 and 20, the two light having different wavelengths are generated from each of areas 105a to 105c.

By providing additional half mirrors on the output side of dichroic mirror 103 and increasing the number of optical paths obtained by equally dividing the light having wavelength $\omega_1$, the number of discrete wavelengths of the light obtained by equally dividing the light having wavelength $\omega_1$ can be increased. Optical outputs of the light having the respective wavelengths in FIG. 20 are preferably adjusted to be nearly equal. However, these optical outputs do not always have to be the same.

By using an optical system, the light outputted from OPO 104 enters a dichroic mirror 108. This dichroic mirror 108 has a high reflection property for the light having wavelength $\omega_1$ and a high transmission property for the light having a wavelength other than wavelength $\omega_1$. Therefore, at dichroic mirror 108, the light having wavelength $\omega_1$ is reflected as shown by an arrow 112, and on the other hand, the light having wavelengths $\omega_2$ to $\omega_7$ after wavelength conversion passes through dichroic mirror 108 as shown by an arrow 113. As described above, the light having wavelengths $\omega_2$ to $\omega_7$ is outputted from the laser light source shown in FIG. 19.

Next, description will be given to an example of a laser light source that produces a continuous spectrum in which optical outputs are flat over a wide band. By using the laser light source (discrete spectral laser light source) shown in FIGS. 19 and 20 as seed laser light source 10 of the MOPA laser light source shown in FIG. 2, and using the fiber laser including preamplifier unit 3 and booster amplifier unit 4, each optical output of a discrete wavelength whose gain is adjusted within a certain wavelength range can be amplified to a peak value of several tens of kilowatts. Furthermore, the optical outputs can be averaged by forcibly inducing stimulated Raman scattering, and adding respective stimulated Raman scattering light generated by the respective light having the discrete wavelengths.

As for a gain medium of the aforementioned fiber laser, a Yb-doped fiber is used as the amplifying optical fiber as already described. Therefore, the wavelength range of the gain is approximately from 1000 nm to 1180 nm, although it depends on the state of population inversion. The gain profile has a peak near 1030 nm. OPO 104 is designed such that the respective wavelengths (wavelengths $\omega_2$ to $\omega_7$) of the discrete spectral laser light source shown in FIG. 19, which is used as seed laser light source 10, fall within the aforementioned gain range. In addition, a threshold value of stimulated Raman scattering is approximately several kilowatts to 30 kilowatts, although it depends on the core diameter of the aforementioned amplifying optical fiber. Therefore, the light from seed laser light source 10 is amplified by the fiber laser to have a peak value equal to or larger than this threshold value.

Figure 21:
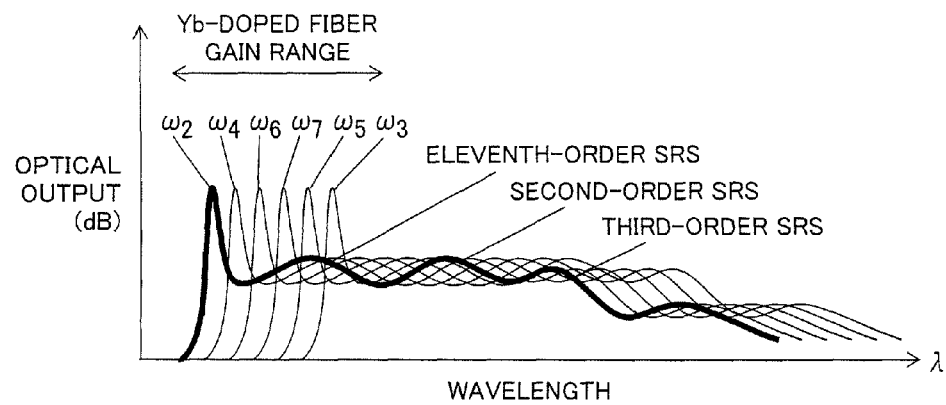
FIG. 21 is a schematic view showing a spectrum of light obtained by averaging optical outputs.

FIG. 21 shows a spectrum of light obtained by averaging the optical outputs as described above. In FIG. 21, the horizontal axis indicates wavelength (unit: dB). It is preferable that the respective wavelengths (wavelengths $\omega_2$ to $\omega_7$) of the discrete spectral laser light source fall within the gain range of the Yb-doped fiber as described above. In addition, the components (e.g., the first-order SRS component to the third-order SRS component) formed due to stimulated Raman scattering (SRS) overlap with one another over a wide wavelength range, and thereby the optical outputs are averaged as a whole.

Narrowing intervals between the respective wavelengths of the light having the plurality of wavelengths that are obtained from the discrete spectral laser light source shown in FIG. 19 and the like, and using light having a larger number of wavelengths ($\omega_n$) are effective at further enhancing a degree of averaging (flattening) of the optical outputs. In addition, it is desirable to adjust the optical outputs of the light of the respective wavelengths obtained from the discrete spectral laser light source such that the optical outputs of the amplified light of the respective wavelengths are nearly equal, taking the gain profile of the used amplifying optical fiber into consideration.

A method for adjusting the optical outputs as described above includes, for example, a method for adjusting reflectivity and transmittance of the respective wavelengths at mirrors 106a to 106c and 107a to 107c included in areas 105a to 105c in OPO 104 shown in FIG. 19, and a method implemented by the combined use of an attenuator, a filter and the like.

Characteristic features of the present invention will be listed hereinafter, although they may partially overlap with those in the aforementioned embodiment. The laser processing method according to the present invention includes the steps of: preparing material to be processed 6 (material to be processed preparation step (S10)); and forming a modified area in material to be processed 6, by irradiating material to be processed 6 with laser beam (laser irradiation step (S20)). In the laser irradiation step (S20), pulsed laser beam 15 having a continuous spectrum is focused with lens 9, thereby forming a focusing line constituted by a plurality of focuses that are obtained by predetermined bands forming the continuous spectrum of laser beam 15, and material to be processed 6 is irradiated with laser beam 15 such that at least a part of the focusing line is located on a surface (glossy surface 12 or satin-finished surface 13) of material to be processed 6, thereby forming the modified area on an axis of the focusing line.

With such a configuration, since the wavelength components forming the continuous spectrum are focused and thereby the focusing line (collection of the focusing points (focuses)) is formed, the modified area extending long in the irradiation direction of laser beam 15 (e.g., in the depth direction) can be formed in an area where the focusing line is located or on the axis of the focusing line in material to be processed 6. Therefore, when material to be processed 6 is cut using the modified area as an origination area, the shape of a cut surface can be flattened in a stable manner because the modified area extending long in the certain direction preexists. In addition, since the modified area extending long in the irradiation direction of laser beam 15 can be formed by one laser irradiation, the process cost can be reduced as compared with the case where laser irradiation is repeated a plurality of times.

In the aforementioned laser processing method, in the step of forming a modified area (laser irradiation step (S20)), material to be processed 6 may be irradiated with laser beam 15 such that the whole of the focusing line is located outside material to be processed 6. In this case, the modified area extending in the irradiation direction of laser beam 15 can be formed at a portion adjacent to the focusing line inside material to be processed 6.

In the aforementioned laser processing method, in the step of forming a modified area (laser irradiation step (S20)), laser beam 15 may enter from a first surface (glossy surface 12) of material to be processed 6, and the modified area may be formed on a second surface (satin-finished surface 13) side located opposite to the first surface in a thickness direction of material to be processed 6.

As described above, the modified area can be formed at a position near satin-finished surface 13 that is the surface (second surface) opposite to the surface irradiated with laser beam 15. Therefore, occurrence of the following problem can be suppressed: when a semiconductor layer, for example, is formed on the first surface (glossy surface 12 that is the surface irradiated with the laser beam) of material to be processed 6, the semiconductor layer on the glossy surface 12 side is damaged due to formation of the modified area.

In the aforementioned laser processing method, in the material to be processed preparation step (S10), the first surface (glossy surface 12) of material to be processed 6 may be mirror-finished and the second surface (satin-finished surface 13) may be satin-finished.

In the aforementioned laser processing method, pulsed laser beam 15 having the continuous spectrum may be generated using a Raman scattering effect on pulsed laser that is seed laser of the laser beam. In this case, using the Raman scattering effect, pulsed laser beam 15 having the continuous spectrum required in the present invention can be readily obtained from single-wavelength laser light emitted from the laser light source (seed laser light source 10). In addition, since the Raman scattering effect is used as described above, occurrence of such a problem that the pulse width of obtained laser beam 15 is widened due to formation of the laser beam having the continuous spectrum can be prevented.

In the aforementioned laser processing method, as in the case of graphs A and B in FIG. 3, with respect to intensity of a maximum peak wavelength having the highest intensity among wavelength components constituting the continuous spectrum of laser beam 15, total intensity of the wavelength components other than the maximum peak wavelength among the wavelength components constituting the continuous spectrum may be 10% or more. In this case, by configuring the wavelength components other than the maximum peak wavelength to have certain intensity, the modified area can also be reliably formed by a portion of the focusing line corresponding to the focusing points formed by the wavelength components other than the maximum peak wavelength.

In the aforementioned laser processing method, the wavelength components constituting the continuous spectrum of laser beam 15 may include one or more local peak wavelength(s) exhibiting a local maximum value of the intensity among the wavelength components other than the maximum peak wavelength, and a maximum value of a difference between the maximum peak wavelength and one or more local peak wavelength(s) may be 100 nm or more. In this case, by sufficiently increasing the wavelength distribution width in the continuous spectrum, the obtained focusing line can be configured to have a length that is equal to or longer than a certain length. As a result, the length of the modified area in the irradiation direction of laser beam 15 can be sufficiently increased.

In addition, a laser processing method according to the present invention includes the steps of: preparing a material to be processed 6 (material to be processed preparation step (S10)); and forming a modified area in material to be processed 6, by irradiating material to be processed 6 with laser beam of pulsed laser (laser irradiation step (S20)). In the step of forming a modified area (laser irradiation step (S20)), the pulsed laser of a predetermined spectral band having a spectral range of 50 nm or more is focused as the laser beam by focusing means (lens 9), and thereby a focusing portion of each spectral component included in the pulsed laser is formed, for each pulse shot, on a straight line in a focusing direction as a predetermined focusing area, and material to be processed 6 is irradiated with the laser beam, and thereby the modified area generated from the focusing area on the straight line is formed inside material to be processed 6. It is to be noted that each pulse shot as described above refers to irradiated pulsed laser for every one pulse on a time axis.

With such a configuration, the focusing portion of each spectral component included in the pulsed laser is formed on the straight line in the focusing direction as the predetermined focusing area. Therefore, the modified area generated from the focusing area can be formed inside material to be processed 6 to extend linearly. Thus, when material to be processed 6 is cut using the modified area as an origination area, the shape of a cut surface can be flattened in a stable manner because the linearly-extending modified area preexists. In addition, by focusing and using the pulsed laser of the predetermined spectral band as the laser beam, the modified area extending long in the irradiation direction of the laser beam can be formed by one laser irradiation. Therefore, the process cost can be reduced as compared with the case where laser irradiation is repeated a plurality of times.

In addition, a laser processing method according to the present invention includes the steps of: preparing a material to be processed; and forming a modified area in the material to be processed, by irradiating the material to be processed with laser beam of pulsed laser. In the step of forming a modified area, the pulsed laser of a predetermined spectral band including a continuous spectral range of 50 nm or more is focused as the laser beam by focusing means, and thereby a focusing portion of each spectral range included in the pulsed laser is formed, for each pulse shot, linearly along a focusing direction as a predetermined focusing area, and the material to be processed is irradiated with the laser beam, and thereby the modified area generated from the linear focusing area is formed inside the material to be processed.

With such a configuration, the focusing portion of each spectral range included in the pulsed laser is formed linearly along the focusing direction as the predetermined focusing area. Therefore, the modified area generated from the focusing area can be formed inside material to be processed 6 to extend linearly. Thus, when material to be processed 6 is cut using the modified area as an origination area, the shape of a cut surface can be flattened in a stable manner because the linearly-extending modified area preexists. In addition, since the modified area extending long in the irradiation direction of the laser beam can be formed by one laser irradiation, the process cost can be reduced as compared with the case where laser irradiation is repeated a plurality of times.

In the aforementioned laser processing method, the predetermined spectral band may include a discrete spectral range other than the continuous spectral range of 50 nm or more.

In the aforementioned laser processing method, the predetermined spectral band may include the spectral range having a continuous spectrum or a plurality of discrete spectra as shown in FIGS. 3 and 21.

In the aforementioned laser processing method, the laser beam may include a CW (Continuous Wave) component.

In the aforementioned laser processing method, the pulsed laser may include single pulsed laser obtained by synchronously combining a plurality of pulsed laser from a plurality of pulsed laser light sources that separately generate pulsed laser having different spectra. For example, the plurality of areas 105a to 105c in OPO 104 shown in FIG. 19 can be considered to correspond to the aforementioned plurality of pulsed laser light sources, and the pulsed laser obtained by amplifying the pulsed laser outputted from dichroic mirror 108 in FIG. 19 by preamplifier unit 3 and booster amplifier unit 4 shown in FIG. 2 corresponds to the aforementioned single pulsed laser. Alternatively, the single pulsed laser may be configured by preparing a plurality of MOPA laser light sources having different properties as shown in FIG. 2, and combining, by a conventionally well-known combining apparatus, pulsed laser having different spectra that are outputted from the plurality of MOPA laser light sources. With such a configuration, by adjusting the spectra of the combined pulsed laser, a spectrum of the obtained single pulsed laser can be adjusted.

In the aforementioned laser processing method, the pulsed laser may have a component derived from fundamental pulsed laser inputted to a passive fiber (passive optical fiber 45), and a continuous spectral component having a spectral width of 50 nm or more and formed using a stimulated Raman scattering effect on the fundamental pulsed laser at passive optical fiber 45 as shown in FIG. 21.

In the aforementioned laser processing method, in the pulsed laser, power of spectral components other than a spectral range of the fundamental pulsed laser, of spectral components constituting the continuous spectral component, may be 10% or more with respect to power of the fundamental pulsed laser. In this case, by configuring the spectral components other than the spectral range of the fundamental pulsed laser to have certain power (intensity), the modified area can also be reliably formed by a portion of the focusing area corresponding to the focusing points formed by the spectral components other than the fundamental pulsed laser.

The power of the fundamental pulsed laser herein refers to power before being affected by the stimulated Raman scattering effect (power of the pulsed laser after amplifying optical fiber 44 and before passive optical fiber 45 in FIG. 2). The spectral components other than the spectral range of the fundamental pulsed laser refer to the spectral components in a range on the long wavelength side from the wavelength of the spectrum on the long wavelength side where the power of the fundamental pulsed laser is 5%, with respect to the power of the center spectrum of the fundamental pulsed laser. The numeric value of 5% herein is used as an indicator of separation from the Raman components. It is to be noted that amplified spontaneous emission (ASE) (e.g., a component in wavelength area 71 in FIG. 3) generated in the laser amplification process is continuous laser, not the pulsed laser in the above description.

In the aforementioned laser processing method, the continuous spectrum may include one or more local peak spectrum (spectra) in which power has a local maximum value, among components other than a peak spectral range of the fundamental pulsed laser, and a minimum interval between a peak spectrum (wavelength) of the fundamental pulsed laser and the one or more local peak spectrum (wavelength) may be 100 nm or more. In this case, by sufficiently increasing the wavelength distribution width in the continuous spectrum, the obtained focusing line can be configured to have a length that is equal to or longer than a certain length. As a result, the length of the modified area in the irradiation direction of laser beam 15 can be sufficiently increased.

In the aforementioned laser processing method, in the step of forming a modified area (laser irradiation step (S20)), the material to be processed may be irradiated with the laser beam such that a part or the whole of the focusing area of the laser beam is located inside the material to be processed. In this case, the modified area can be reliably formed inside the material to be processed.

In the aforementioned laser processing method, in the step of forming a modified area (laser irradiation step (S20)), the laser beam may enter from a first surface of the material to be processed, and a part of the focusing area may be set on a second surface located opposite to the first surface in a thickness direction of the material to be processed and the modified area may be formed to extend from the second surface to the inside of the material to be processed. In this case, the modified area is formed on the second surface opposite to the first surface from which the laser beam enters. Therefore, occurrence of the following problem can be suppressed: when a layer of another material (e.g., a functional layer such as a semiconductor layer) is formed on the first surface side, the layer of the material is damaged due to formation of the modified area.

In the aforementioned laser processing method, in the step of preparing material to be processed 6 (material to be processed preparation step (S10)), the second surface may be non-mirror-finished to have a surface roughness Ra (JIS standard) of 0.1 μm or more and 1.0 μm or less.

In the aforementioned laser processing method, in the step of preparing material to be processed 6 (material to be processed preparation step (S10)), the first surface of the material to be processed may be mirror-finished. In this case, occurrence of a problem such as diffused reflection of the laser beam on the first surface irradiated with the laser beam can be suppressed.

In the aforementioned laser processing method, in the step of preparing material to be processed 6 (material to be processed preparation step (S10)), an epitaxial layer may be formed on the mirror-finished first surface of material to be processed 6. In this case, without damaging the epitaxial layer, material to be processed 6 can be divided together with the epitaxial layer, using, as an origination area, the modified area formed on the second surface side.

Experiment 1

An experiment as described below was conducted to describe the effect of the laser processing method according to the present invention. In the following experiment, the pulse width of pulsed laser used as the laser light source was set to 180 ps.

(Specimen)

A sapphire substrate having a thickness of 400 μm was prepared as a specimen of a material to be processed in the laser processing method according to the present invention. The sapphire substrate had a square planar shape of 10 mm long and 10 mm wide. The surface (glossy surface 12) of the specimen was mirror-finished and the lower surface (satin-finished surface 13) was satin-finished.

(Contents of Experiment)

Pulsed laser beam obtained from the MOPA laser light source shown in FIG. 2 was focused using a lens having a focal length of 20 mm, and the sapphire substrate serving as the material to be processed was irradiated with the focused pulsed laser beam. The laser beam entering the lens had a beam diameter of 5 mm. Laser processing of the sapphire substrate was performed, while changing a distance between the sapphire substrate and the lens such that a position of a focusing line of the laser beam entering the sapphire substrate satisfied five conditions.

Specifically, under a condition 1, as shown in FIG. 6, the specimen was set such that the focal position of a fundamental wave (pulsed laser beam having a wavelength of 1050 nm) matched glossy surface 12 (see FIG. 6) of the sapphire substrate. A tolerance of approximately ±0.1 mm may, however, be allowed because the specimen was visually set such that plasma generation became the most remarkable. Under a condition 2, the specimen was shifted by 0.1 mm from the position under condition 1 such that glossy surface 12 of the specimen moved in the direction toward lens 9 (i.e., the focal position of the fundamental wave moved from glossy surface 12 of the sapphire substrate serving as material to be processed 6 to the inside of material to be processed 6, or in the z-axis direction) (z=0.1 mm). Under a condition 3, the position of glossy surface 12 of the specimen was shifted by 0.2 mm from the position under condition 1 toward the lens 9 side (z=0.2 mm).

Under a condition 4, the position of glossy surface 12 of the specimen was shifted by 0.3 mm from the position under condition 1 toward the lens 9 side (z=0.3 mm). Under a condition 5, the position of glossy surface 12 of the specimen was shifted by 0.4 mm from the position under condition 1 toward the lens 9 side (z=0.4 mm). Conditions of the used laser beam were such that a pulse repetition rate thereof was 1 MHz, a pulse width thereof was 180 ps and an average output thereof was 8 W. The moving speed of the sapphire substrate during laser irradiation was 10 mm/s.

Then, a side surface of the laser beam-irradiated area and the laser-irradiated surface (glossy surface) of the processed specimen were observed with an optical microscope. In addition, as for condition 5, a cross section of a portion where a modified area was formed was observed with an SEM as described below.

(Result)

Figure 22:
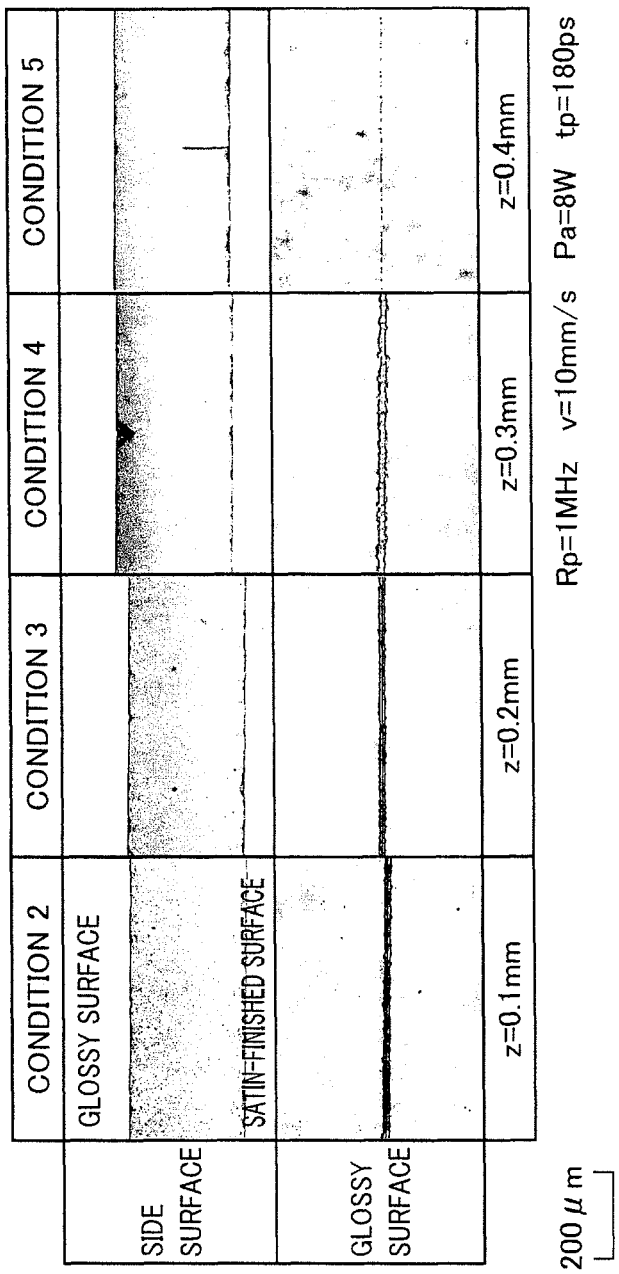
FIG. 22 is a table including microphotographs showing results of Experiment 1.
Figure 23:
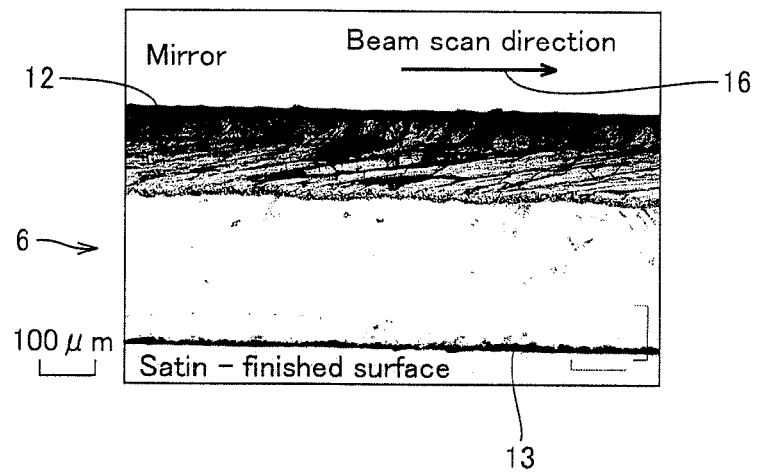
FIG. 23 is a microphotograph showing a cut surface of a specimen under a condition 1.

A result of the experiment will be described with reference to FIGS. 22 to 24. FIG. 22 shows optical microphotographs showing states of the side surface and the glossy surface (laser-irradiated surface) of the specimen after laser processing under conditions 2 to 5. Specifically, in FIG. 22, four columns show optical microphotographs of the laser-irradiated portion of the specimen under conditions 2 to 5 in order from left to right. An upper photograph in each column is an optical microphotograph of the side surface of the laser-irradiated portion and a lower photograph is an optical microphotograph of the glossy surface that is the laser-irradiated surface. The optical microphotographs in FIG. 22 are obtained by observing the side surface (end face) of the specimen from the X-axis direction shown in FIG. 6. As can also be seen from FIG. 22, under conditions 2 and 3, a laser irradiation mark could be found on the laser-irradiated portion in the glossy surface that is the laser beam-irradiated surface. However, a modified area was hardly formed in the depth direction in the side surface of the laser-irradiated portion.

On the other hand, under condition 5, a laser irradiation mark that was extremely thinner than those under conditions 2 to 4 was found on the glossy surface that is the laser-irradiated surface, while a modified area (altered layer) having a depth of approximately 90 µm was formed from the lower surface (satin-finished surface) that is a surface opposite to the laser-irradiated side. In the specimen under condition 1, a modified area having a depth of 100 µm or more was formed from the glossy surface 12 side that is the laser beam-irradiated surface. Then, under condition 1, the specimen was cut at the laser beam-irradiated portion by laser irradiation. FIG. 23 is an optical microphotograph showing a cut surface of the sapphire substrate cut by laser processing under condition 1. In FIG. 23, the laser beam scanning direction is indicated by an arrow 16.

As described above, under condition 5, the modified area having a certain depth was formed in the lower surface opposite to the laser-irradiated side. In order to check this modified area under condition 5, the cross section of the specimen under condition 5 was observed with the SEM (scanning electron microscope) as shown in FIG. 24. It is to be noted that in FIG. 24, the satin-finished surface (lower surface opposite to the laser-irradiated surface) of the specimen is located on the upper side.

Figure 24:
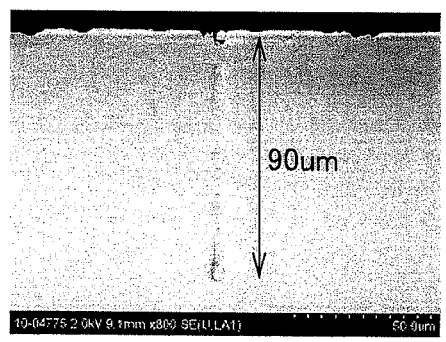
FIG. 24 is an SEM photograph showing a cross section of the specimen under a condition 5.
Figure 25:
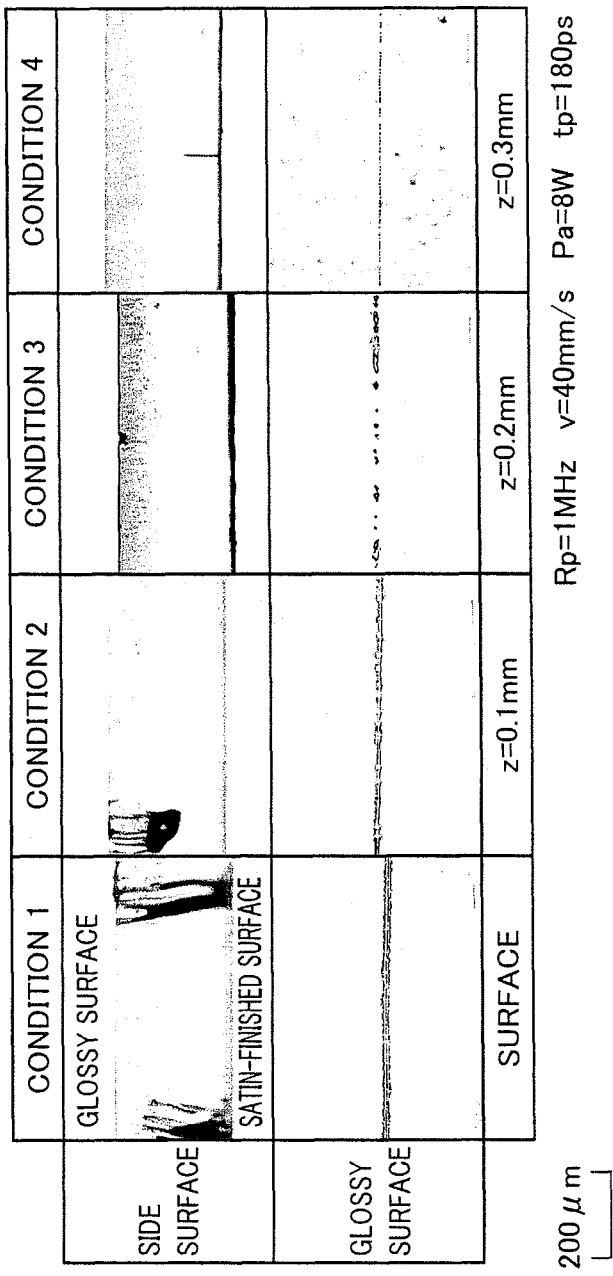
FIG. 25 is a table including microphotographs showing results of Experiment 2.

As can be seen from FIG. 24, the modified area having a width of about 5 µm was formed to reach a depth of 90 µm from the upper surface side (satin-finished surface side) in FIG. 24. It is to be noted that this modified area had an aspect ratio (depth/width) of 18 and exhibited an extremely high aspect ratio.

As can also be seen from FIG. 24, a portion that is considered to be a spot point of modification was found at a depth of about 90 µm from the satin-finished surface shown in FIG. 24 (upper surface in FIG. 24). This probably shows that the focusing point (focus) of the fundamental wave component having the highest power distribution, of the wavelength components of the laser beam, in the focusing line shown in FIG. 7, forms the spot point of modification of the sapphire substrate serving as the material to be processed. It is considered that since the focusing line constituted by the focuses of the third-order to fourth-order SRS components reaches the lower surface side (satin-finished surface side), the aforementioned modified area having an extremely large aspect ratio (having a narrow width and a long distance in the depth direction) can be formed without using the femtosecond pulsed laser as in the conventional art.

As can also be seen from FIG. 24, a portion closer to opposing ends of the modified area in the depth direction seems to be subjected to a higher degree of processing. This probably shows that the focus formed by the fundamental wave component and the focus formed by the third-order SRS component, of the irradiated laser beam, are located at the opposing ends of the modified area in the depth direction, and contribute to formation of the spot point of modification. Condition 5 is different from the other conditions 2 to 4 in that the position of the focus formed by the third-order SRS component is substantially the same as the position of the satin-finished surface that is the lower surface side. Therefore, it is considered that this contributes to formation of the modified area under condition 5.

It is to be noted that the aforementioned laser irradiation conditions were substantially similar to the laser irradiation conditions corresponding to the data of graph B shown in FIG. 3. As described above, as for the irradiated laser beam, it is considered to be desirable that the ratio between the power of the fundamental wave and the power of the sum total of the SRS components should have an appropriate value.

Experiment 2

The laser beam irradiation conditions were changed and an experiment was conducted to check the effect of the laser processing method according to the present invention.

(Specimen)

A specimen (sapphire substrate) similar to the specimen prepared in aforementioned Experiment 1 was prepared as a material to be processed.

(Contents of Experiment)

Laser processing of the prepared sapphire substrate was performed similarly to Experiment 1. The laser beam irradiation conditions were basically similar to those in aforementioned Experiment 1 except that the moving speed of the specimen was set to 40 mm/s. Using conditions similar to conditions 1 to 4 in aforementioned Experiment 1 as conditions about the distance between the specimen and the lens, laser processing experiments were conducted, respectively. Then, a side surface of a laser beam-irradiated area and a laser-irradiated surface (glossy surface) of the processed specimen were observed with the optical microscope. In addition, as for condition 4, a cross section of a portion where a modified area was formed was observed with the SEM as described below.

(Result)

Referring to FIGS. 25 to 28, under conditions 1 to 3, although the laser irradiation mark was found on the glossy surface that is the surface on the laser-irradiated side, a modified area extending deeply in the thickness direction was hardly formed. On the other hand, under condition 4, a modified area was formed on the lower surface side (satin-finished surface side) in a manner qualitatively similar to the case under condition 5 in Experiment 1. In addition, under condition 4, the laser irradiation mark on the glossy surface side was relatively minor as compared with those under the other conditions.

Figure 26:
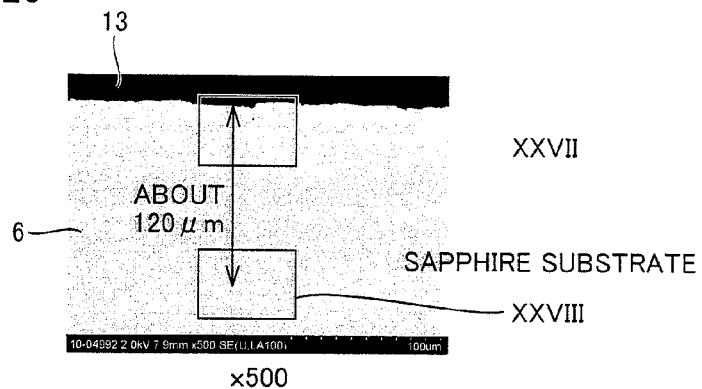
FIG. 26 is an SEM photograph showing a cross section of a specimen under a condition 4.
Figure 27:
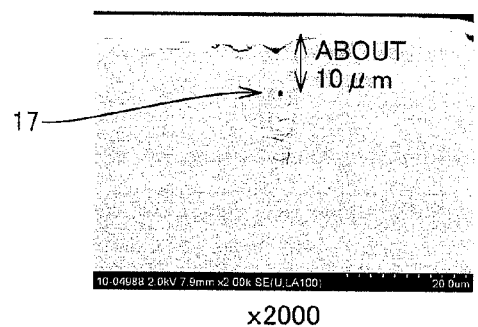
FIG. 27 is an enlarged SEM photograph showing an area XXVII in FIG. 26.
Figure 28:
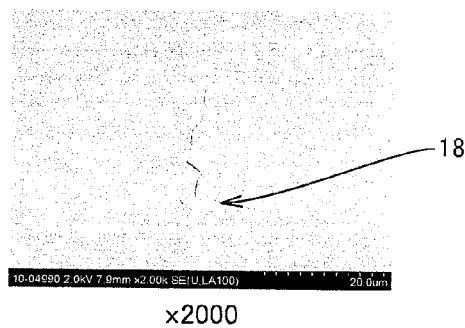
FIG. 28 is an enlarged SEM photograph showing an area XXVIII in FIG. 26.

As a result of observation with the SEM of the cross section of the portion where the modified area was formed in the specimen under condition 4, a modified area was formed to reach a depth of about 120 μm (specifically, almost 125 μm) from the lower surface side (satin-finished surface side) as shown in FIGS. 26 to 28. As shown in FIGS. 27 and 28, areas 17 and 18, which were considered to be modification spots (nucleuses), were formed at opposing ends of the modified area in the depth direction, respectively. Specifically, area 17 (nucleus) serving as the modification spot was found at a depth of about 10 μm from the satin-finished surface as shown in FIG. 27, and the other area 18 (nucleus) serving as the modification spot was found at a depth of 125 μm from the satin-finished surface as shown in FIGS. 26 and 28.

This probably shows that in consideration of the distance between the specimen (sapphire substrate) and the lens, and the like, area 18 shown in FIG. 28 corresponds to a position of the focus formed by the fundamental wave of the laser beam, and area 17 in FIG. 27 corresponds to the focus formed by the fourth-order SRS component. It is considered that these focuses formed by the fundamental wave and the fourth-order SRS component are located at the opposing ends of the modified area (processing line) and contribute to formation of areas 17 and 18.

If, by increasing energy of the irradiated laser beam, sufficient fluence is obtained in the focusing line formed as a result of focusing the laser beam, the modified area could be probably formed inside the sapphire substrate even when the focusing line does not intersect the satin-finished surface (lower surface) of the sapphire substrate serving as the material to be processed as in the cases under conditions 3 and 4 in Experiment 1 or as in the cases under conditions 2 and 3 in Experiment 2.

An epitaxial layer is not particularly formed on the satin-finished surface of the sapphire substrate. In addition, aforementioned formation of the modified area seems to have little influence on the epitaxial layer and the like formed on the glossy surface of the sapphire substrate. Therefore, when the modified area is formed along the focusing line of the laser beam under a condition of a relatively low average power, the position of the focusing line is not arranged to be completely included in the material to be processed in the thickness direction, but is preferably arranged such that a part of the focusing line intersects a part of the surface side or the lower surface side of the material to be processed, and is more preferably arranged such that a part of the focusing line intersects the lower surface side (satin-finished surface 13 side of material to be processed 6).

When laser beam having a single wavelength is focused to form a dot-like focusing point (focus), and the focusing point is arranged inside a material to be processed as in the conventional art, a dot-like altered area (altered point) is formed inside the material to be processed. On the other hand, in the present invention, the SRS is intentionally generated in the laser beam, thereby obtaining the focusing line constituted by the linearly-arranged focusing points (focuses) that are formed by focusing the laser beam with the lens, and the material to be processed is irradiated with the laser beam such that the focusing line intersects the surface or the lower surface of the material to be processed. As a result, the modified area extending in the depth direction of the material to be processed can be formed by one laser irradiation.

Furthermore, when laser irradiation is performed with the dot-like focusing point arranged inside the material to be processed as in the conventional art, laser irradiation must be performed a plurality of times to form a wide modified area. According to the present invention, however, the strip-shaped modified area can be formed over a wider range by one laser irradiation. Furthermore, in the present invention, the modified area having a large aspect ratio can be formed without using the femtosecond-range short pulsed laser that is difficult to be generated.

The aforementioned fiber laser is preferably used as the laser light source. However, by using a delivery optical fiber having a substantially single mode to intentionally generate the SRS, a solid-state laser can also be used as the laser light source for the laser processing method according to the present invention.

Another experimental example will be described hereinafter.

In the present experiment, a pulsed fiber laser for finely processing (manufactured by Sumitomo Electric Industries, Ltd.) is used as a laser oscillator. This laser oscillator is an MOPA-type oscillator similarly to the laser apparatus shown in FIG. 2, in which a semiconductor laser that allows high-speed modulation is used as a seed laser light source and power amplification is performed by an amplifier. Therefore, the pulse width and the number of repetition can be set independently. The laser oscillator has an oscillation center wavelength of 1060 nm and a wide range of the number of pulse repetition and the pulse width can be selected. Laser beam having a diameter of 1.6 mm, which was outputted from a collimator lens, passes through an isolator, and thereafter, is expanded by fivefold by a beam expander and focused onto a specimen by an achromatic lens having a focal length of 20 mm.

Figure 29:
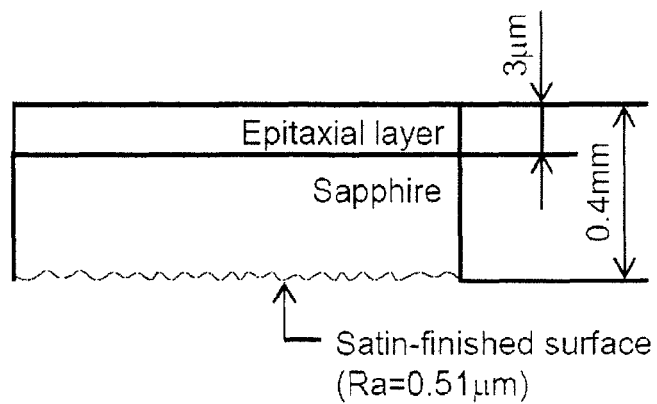
FIG. 29 is a schematic cross-sectional view of a specimen used in the present experimental example.

FIG. 29 is a schematic cross-sectional view of the specimen used in the present experimental example. The specimen has a stacked structure obtained by forming an epitaxial layer on a sapphire substrate. The sapphire substrate has a thickness of approximately 400 μm, and the epitaxial layer made of gallium nitride (GaN) and having a thickness of 0.3 μm is deposited on a mirror-polished surface of the sapphire substrate. A surface of the sapphire substrate located opposite to the mirror-polished surface is a satin-finished surface (having a surface roughness Ra (arithmetic mean roughness Ra in accordance with B0601 of JIS standard (Japanese Industrial Standard)) of 0.51 μm).

Figure 30:
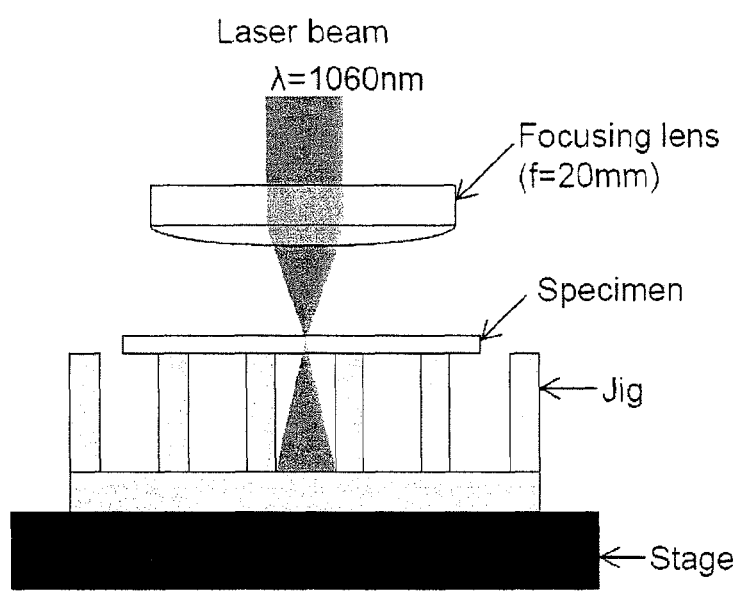
FIG. 30 is a schematic, view showing irradiation of the specimen with laser beam.

FIG. 30 is a schematic view showing irradiation of the specimen with the laser beam. A fiber laser light source having high peak power and a wideband spectrum as described above is used as the laser light source. As described above, the specimen (epitaxial layer/sapphire substrate) is irradiated through the focusing lens (f=20 mm) with the laser beam outputted from the laser light source. The specimen is arranged on a jig as shown in FIG. 30. The jig is mounted on a xyz movable stage. The specimen is irradiated with the laser beam from the side where the epitaxial layer is formed. It is to be noted that the jig is made of Al and a jig having the shape of an elongated strip is used to suppress reflected light of the laser beam.

Figure 31:
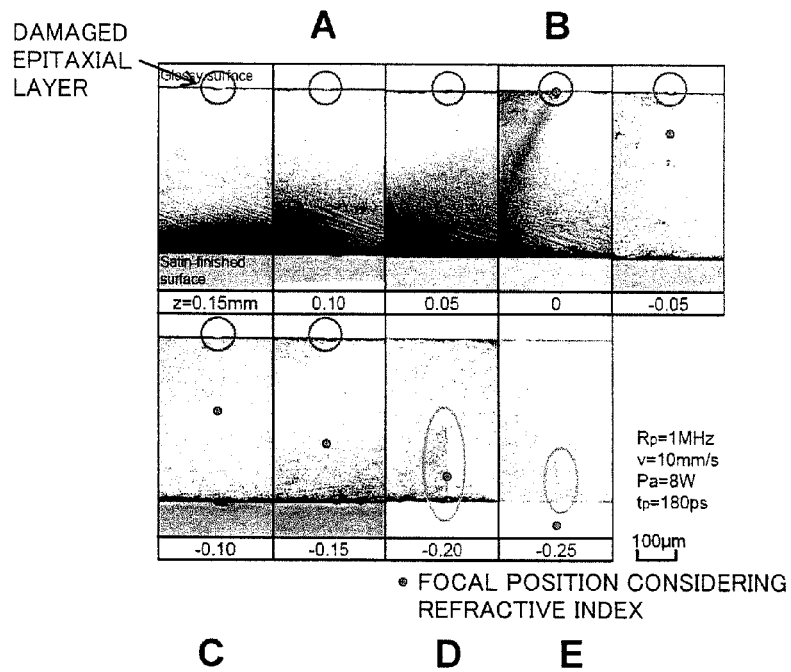
FIG. 31 is cross-sectional photographs of the specimen (sapphire substrate) after laser irradiation.
Figure 32:
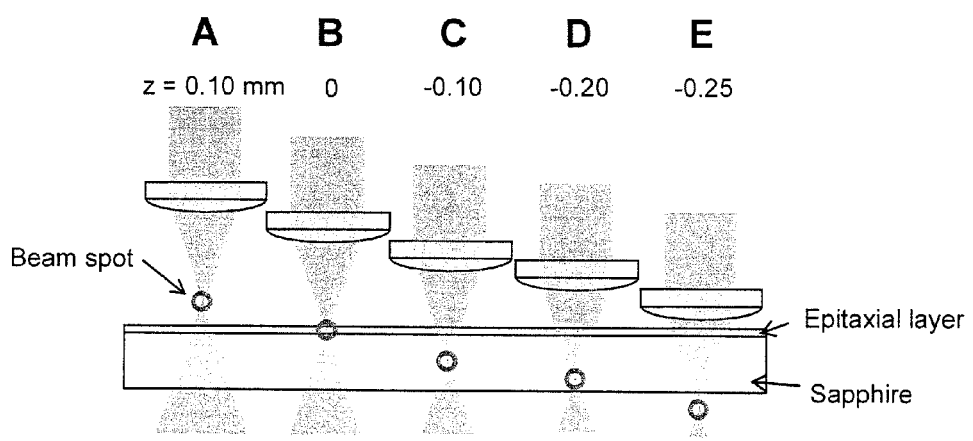
FIG. 32 is a schematic view showing a relationship between the specimen and the focal position in each of a case A to a case E shown in FIG. 31.

FIG. 31 is cross-sectional photographs of the specimen (sapphire substrate) after laser irradiation. FIG. 32 is a schematic view showing a relationship between the specimen and the focal position in each of a case A to a case E shown in FIG. 31.

FIG. 31 shows a cross-sectional shape of a processing mark observed in the vertical direction with respect to a laser beam scanning axis when the focal position is moved in increments of 50 μm, and the specimen is irradiated with the laser beam from above in the figure. "z" represents the height of the stage. By controlling the height of the stage, the relative position of the focusing lens and the specimen in the depth direction can be adjusted (symbols A to E shown in FIG. 31 correspond to A to E in FIG. 32). The optical microscope is used for observations and light is applied from the direction opposite to the observation direction. When the focal position is located on the surface of the specimen, a focal position z is defined as z=0. When the focal position is located above the surface of the specimen (above the specimen), focal position z is defined as positive. When the focal position is located below the surface of the specimen (inside the specimen), focal position z is defined as negative.

When A:z=0.1 mm, the focusing point is located at a position in the air that is 0.1 mm above the upper surface of the specimen. When B:z=0, the focusing point is located on the epitaxial layer. When C:z=−0.1 mm and D:z=−0.2 mm, the focusing point is located inside the sapphire substrate that is 0.1 mm and 0.2 mm below the epitaxial layer, respectively. When E:z=−0.25 mm, the focal position passes through the sapphire substrate and is located in the air. It is to be noted that dots shown in FIG. 32 are the focal positions considering a refractive index of the sapphire substrate. As can be seen from FIG. 31, in the range from z=0.15 mm to −0.15 mm, only the epitaxial layer is damaged. On the other hand, in the range from z=−0.2 mm to −0.25 mm, the epitaxial layer is not damaged and a modified area is formed only inside the sapphire substrate.

When z=−0.20 mm and z=−0.25 mm, the linear modified area is formed from the satin-finished surface toward the inside of the substrate. When z=−0.20 mm, the modified area has a width of 5 μm and a height of 180 μm, and a very high aspect ratio of 36 is obtained.

Figure 33:
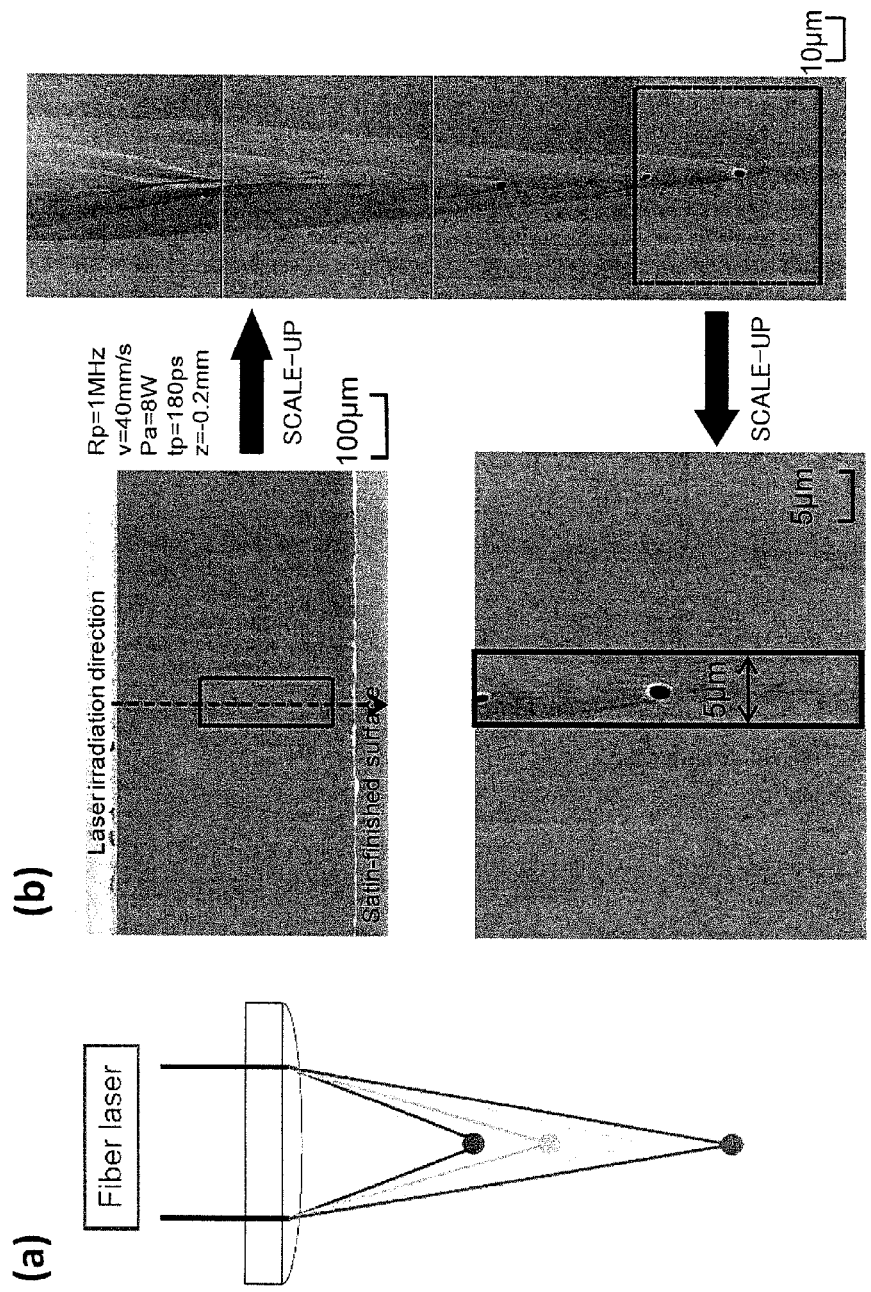
FIG. 33 is a schematic view for describing the formed modified area.

FIG. 33 is a schematic view for describing the formed modified area. FIG. 33(a) is a schematic view for describing features of the laser beam used in the present invention. FIG. 33(b) is cross-sectional photographs for describing the modified area.

As shown in FIG. 33(a), this laser light source has a wide range of spectral width, and thus, the position of the focusing point varies from wavelength to wavelength of the laser beam.

When the laser beam shown in FIG. 33(a) is used for laser irradiation, the modified area is formed inside the sapphire substrate serving as the specimen as shown in FIG. 33(b). As shown in FIG. 33(b), the modified area is linearly formed to connect respective focusing points.

Figure 34:
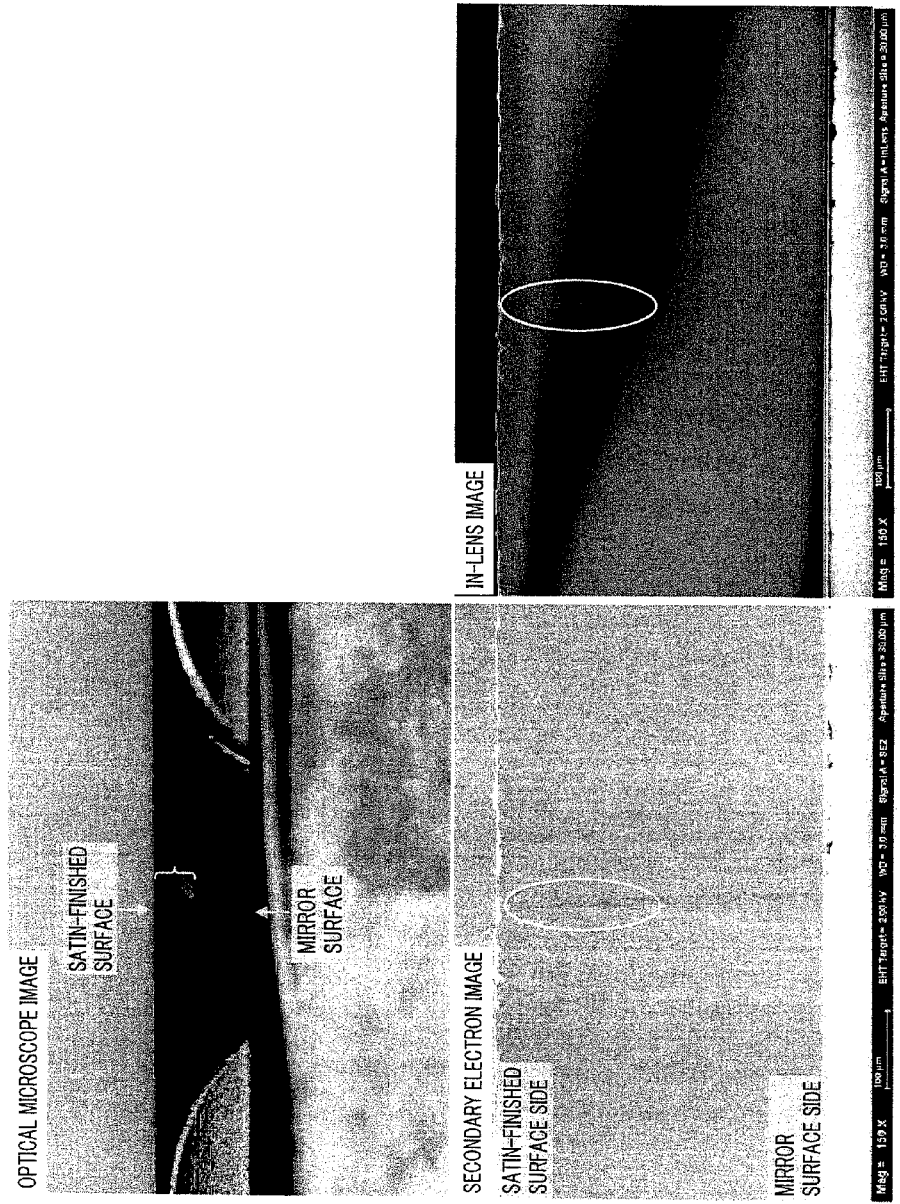
FIG. 34 is photographs showing results of observations of the cross section of the specimen shown in FIG. 33.

FIGS. 34 to 38 show more detailed cross-sectional photographs of the specimen shown in FIG. 33. Specifically, an upper-left photograph in FIG. 34 is an optical microphotograph of the specimen. A lower-left photograph in FIG. 34 is a photograph of the specimen obtained by the scanning electron microscope (SEM) and shows a secondary electron image. A lower-right photograph in FIG. 34 is a photograph of the specimen obtained by the scanning electron microscope (SEM) and shows an in-lens image. The lower-left photograph in FIG. 34 corresponds to the upper-left photograph in FIG. 33(b) flipped vertically.

Figure 35:
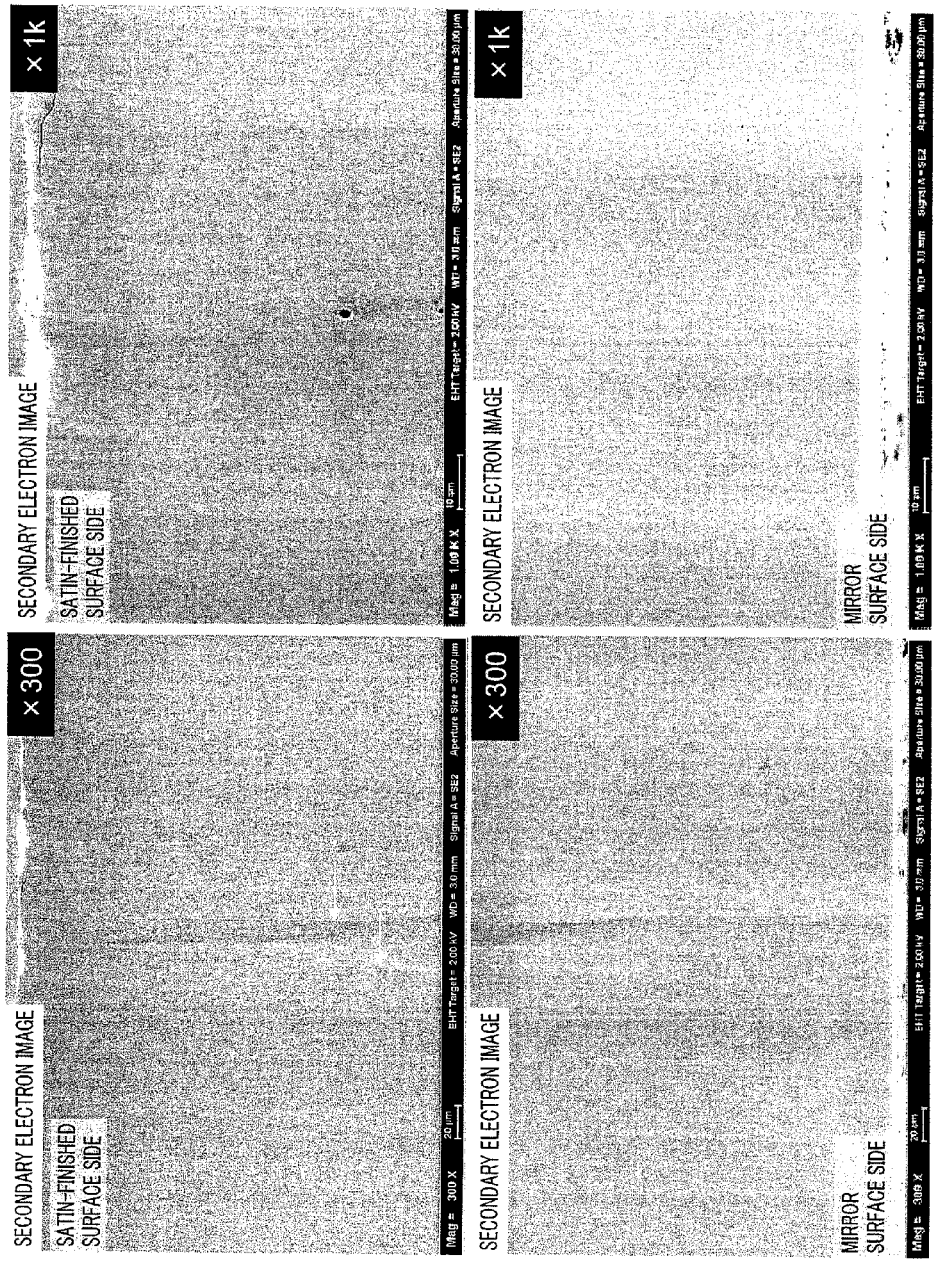
FIG. 35 is partially enlarged photographs of the cross section of the specimen shown in FIG. 34.

An upper-left photograph in FIG. 35 shows a secondary electron image obtained by the SEM and a part of the cross section of the specimen on the satin-finished surface side. An upper-right photograph in FIG. 35 shows a part of the upper-left photograph in FIG. 35. A lower-left photograph in FIG. 35 shows a secondary electron image obtained by the SEM and a part of the cross section of the specimen on the mirror surface side. A lower-right photograph in FIG. 35 shows a part of the lower-left photograph in FIG. 35. It is to be noted that a vertically-extending streak found in, for example, the upper-left photograph in FIG. 35 is a processing mark formed by CP (Cross Section Polisher) processing. In addition to the aforementioned CP processing, processing using an ion beam polishing system may be applied for such surface processing.

Figure 36:
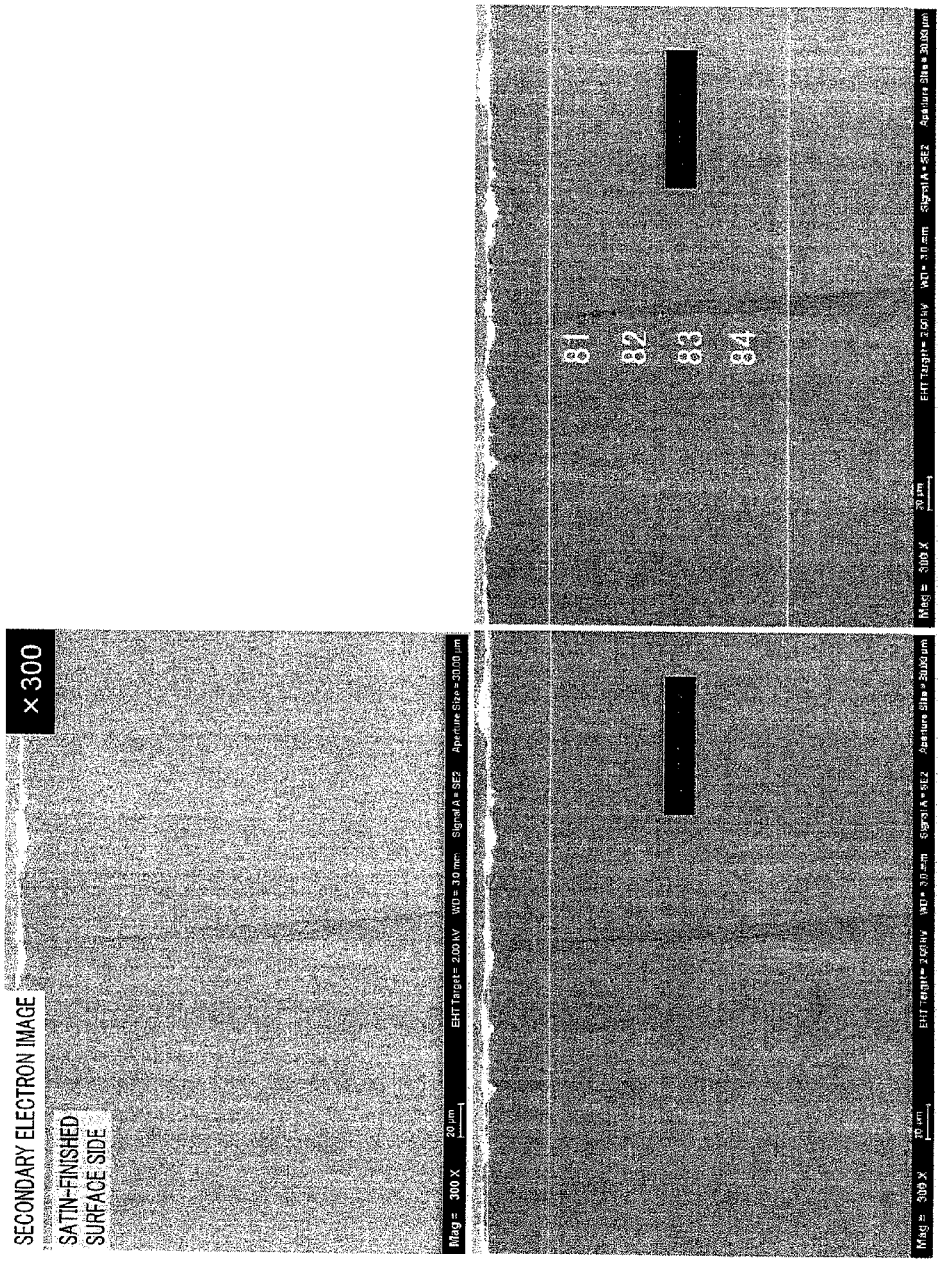
FIG. 36 is partially enlarged photographs of the cross section of the specimen shown in FIG. 34.

Photographs shown in FIG. 36 are substantially the same as the upper-left photograph in FIG. 35. In a lower-right photograph in FIG. 36, however, numbers (81 to 84) for identifying a part of the modified area in the cross section of the specimen are described.

Figure 37:
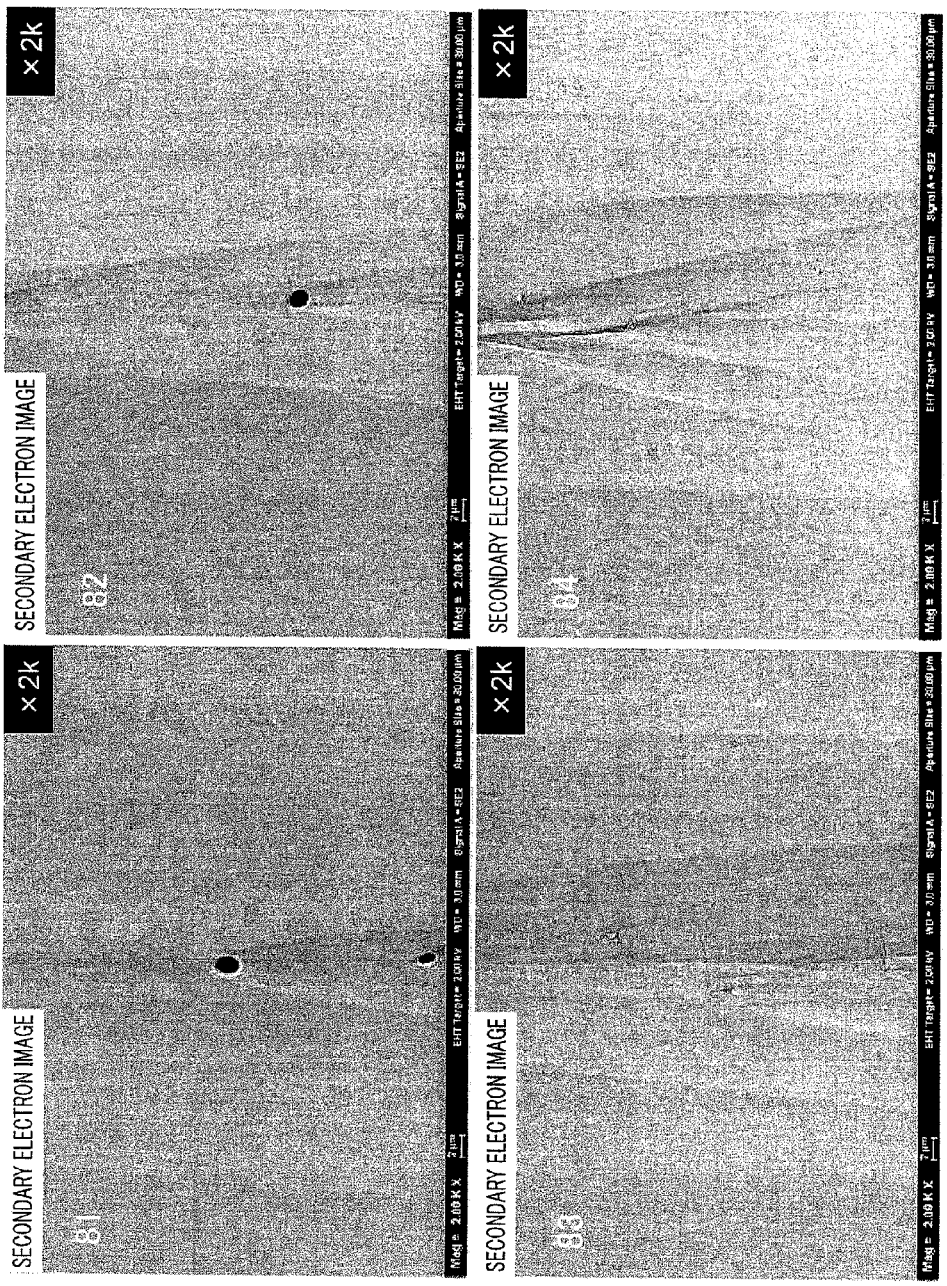
FIG. 37 is partially enlarged photographs of the cross section of the specimen shown in FIG. 36.
Figure 38:
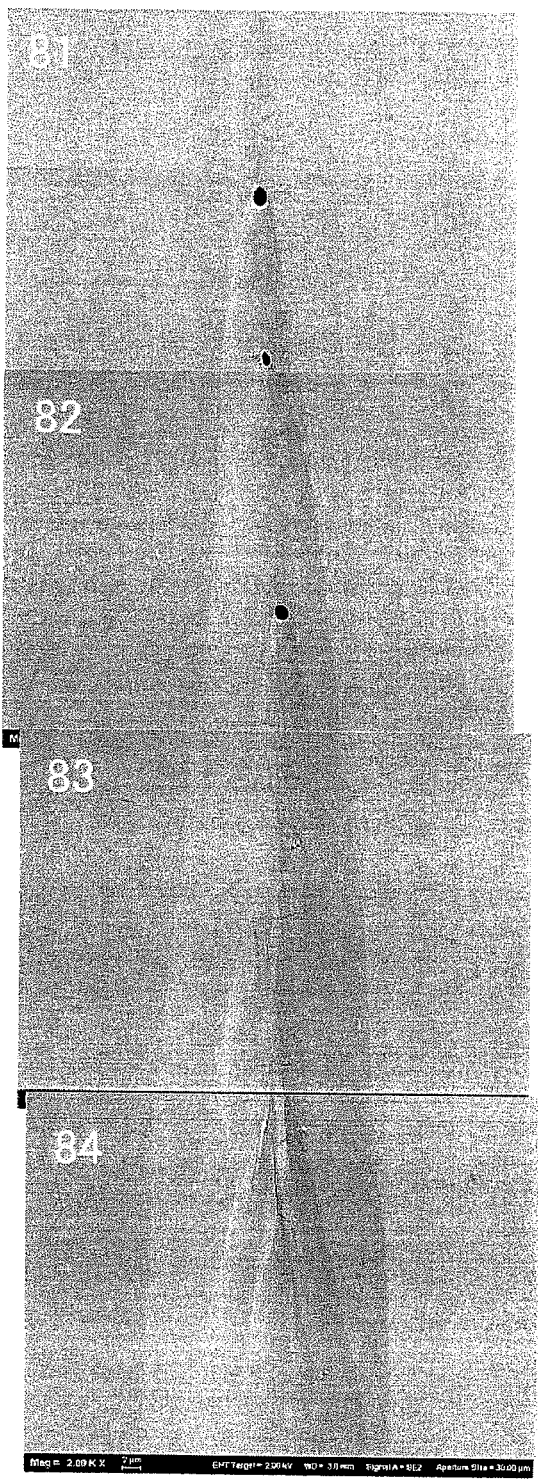
FIG. 38 is partially enlarged photographs of the cross section of the specimen shown in FIG. 36.

Photographs shown in FIG. 37 are SEM photographs showing a part of the modified area indicated by the numbers (81 to 84) in the lower-right photograph in FIG. 36. An upper-left photograph in FIG. 37 corresponds to the lower-left photograph in FIG. 33(b) flipped vertically. FIG. 38 shows a wide area of the modified area by vertically arranging the four photographs shown in FIG. 37. The photographs in FIG. 38 correspond to the right-hand photograph in FIG. 33(b) flipped vertically.

Figure 39:
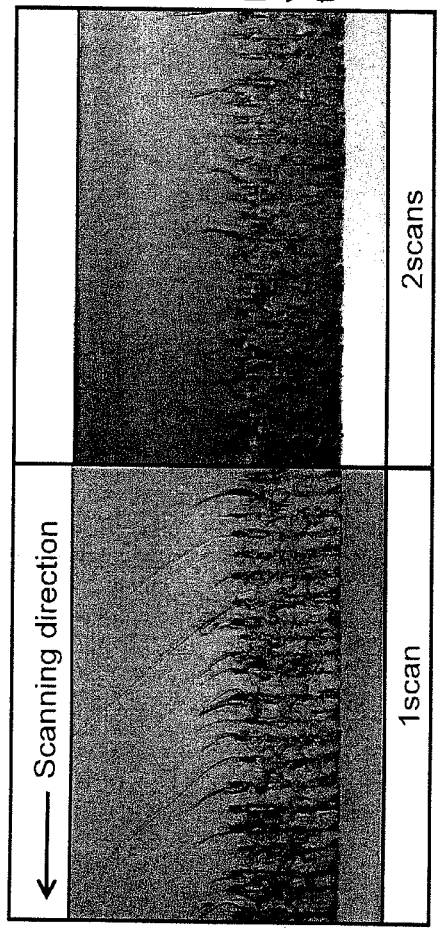
FIG. 39 is a schematic view for describing an influence caused by the number of laser beam scanning.
Figure 39:
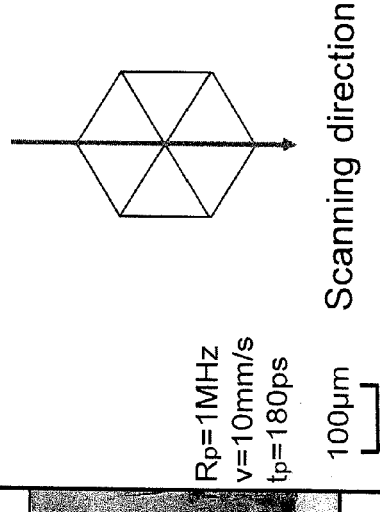
Figure 39:
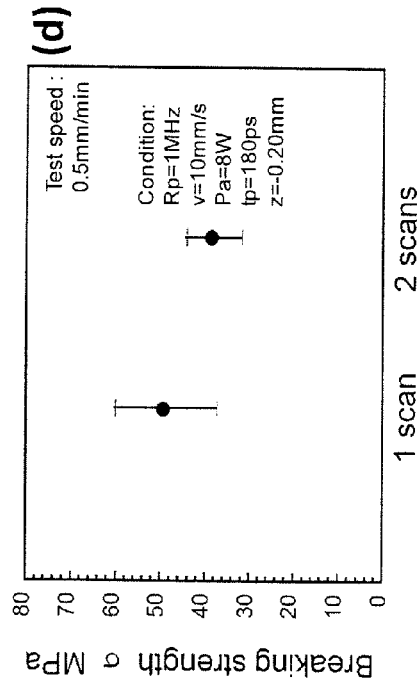

FIG. 39 is a schematic view for describing an influence caused by the number of laser beam scanning. FIGS. 39(a) and (b) are photographs showing results of observations of the cross section after one laser scanning and two laser scannings are performed, respectively, of the specimen having the stacked structure of the epitaxial layer and the sapphire substrate (it is to be noted that the scanning direction of the laser beam entering from the epitaxial layer side corresponds to the perpendicular direction shown in FIG. 18(b)), and a break test is conducted. FIG. 39(c) is a schematic view for describing the scanning direction of the laser beam. As shown in FIGS. 39(a) and (b), it can be seen that streaky marks generated on a fracture cross section are shorter and the modified area is more densely formed in the case of two scannings. A graph in FIG. 39(d) shows a result of measurement of breaking strength for these specimens. The vertical axis in the graph shown in FIG. 39(d) indicates the breaking strength (unit: MPa). Data about the specimen in the case of one scanning (specimen in FIG. 39(a)) is shown on the left side in the graph, and data about the specimen in the case of two scannings (specimen in FIG. 39(b)) is shown on the right side in the graph. As can also be seen from the graph, the breaking strength is lower and variations are also smaller in the case of two scannings. Therefore, multiple scanning is effective when the specimen after internal modification is broken.

Figure 40:
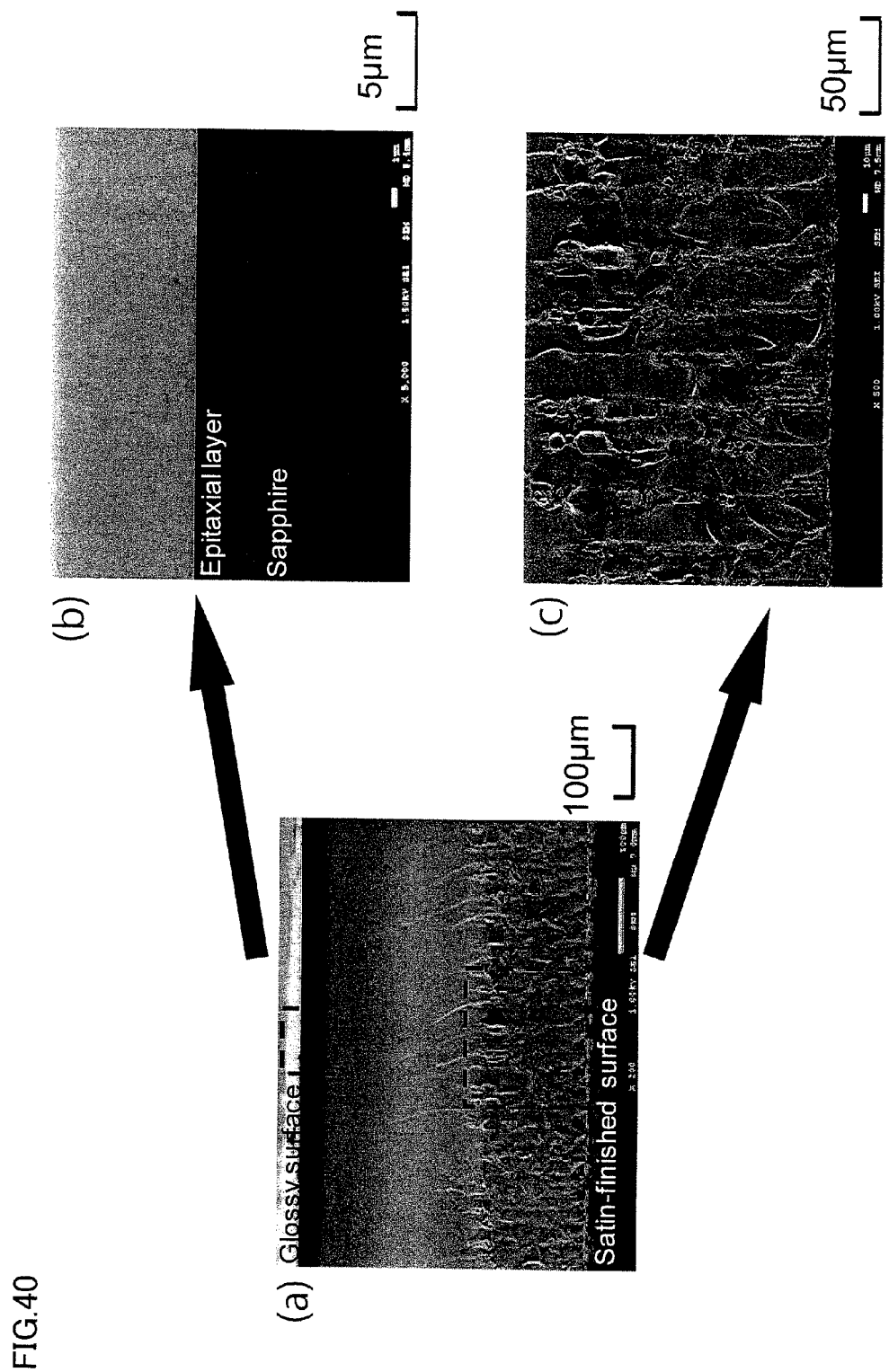
FIG. 40 is photographs showing results of observations of the cross section of the specimen broken using the laser processing method according to the present invention.

FIG. 40 is photographs showing results of observations of the cross section of the specimen broken using the laser processing method according to the present invention. FIG. 40 shows the results of observations of the fracture cross section after two laser scannings of the specimen having the stacked structure of the epitaxial layer and the sapphire substrate. It is to be noted that the laser beam scanning direction corresponds to the scanning direction shown in FIG. 39(c). FIG. 40(a) is a photograph showing the cross section of the specimen. FIG. 40(b) is an enlarged photograph of an area near an interface between the epitaxial layer and the sapphire substrate of the specimen (upper area enclosed by a chain line in FIG. 40(a)). FIG. 40(c) is an enlarged photograph of a part of the modified area of the specimen (lower area enclosed by a chain line in FIG. 40(a)). As shown in FIGS. 40(a) and (c), the modified area having a depth of approximately 200 μm is formed on the satin-finished surface side of the sapphire substrate. As shown in FIG. 40(b), however, great damage to the upper epitaxial layer is not found. In other words, the modified area can be formed without any great damage to the epitaxial layer due to the modified area, and the sapphire substrate can be divided using the modified area.

Figure 41:
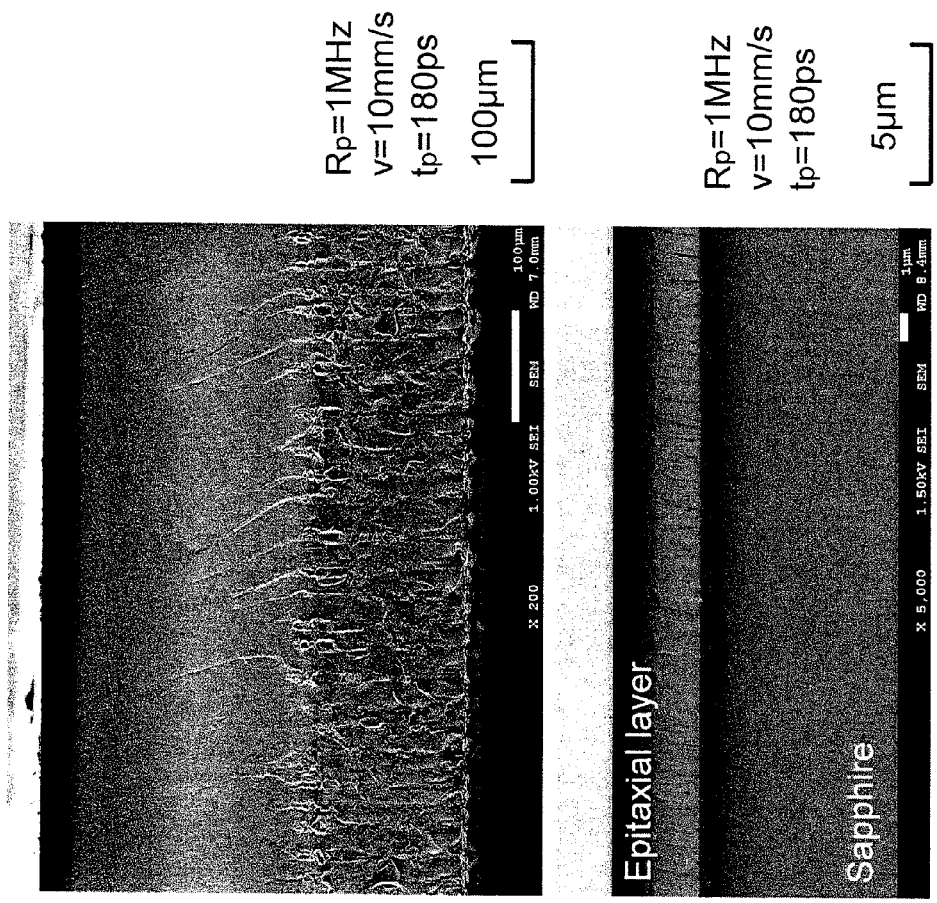
FIG. 41 is photographs showing results of observations of the cross section of the specimen shown in FIG. 40.
Figure 42:
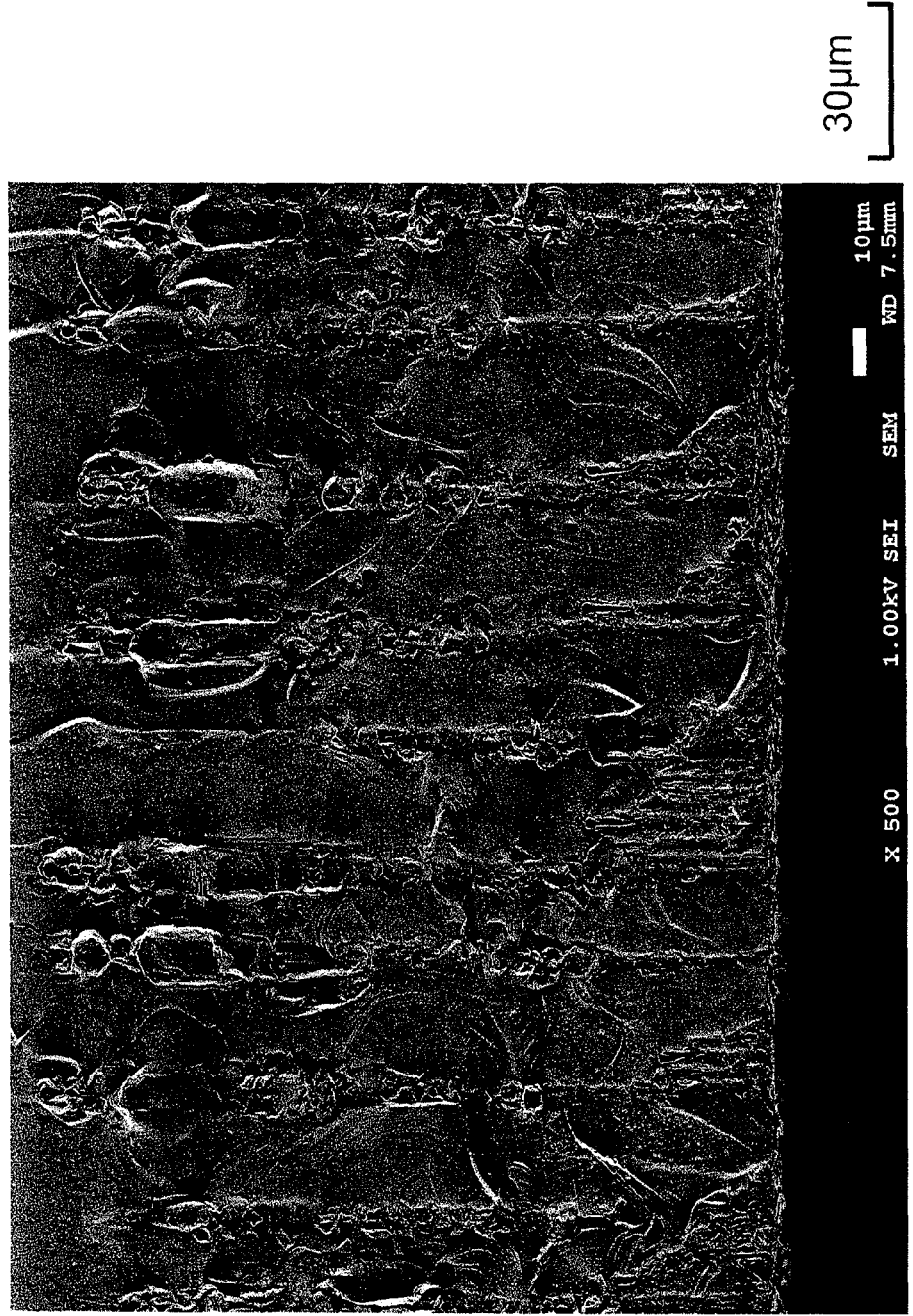
FIG. 42 is a photograph showing a result of observation of the cross section of the specimen shown in FIG. 40.

FIGS. 41 and 42 show more detailed cross-sectional photographs of the specimen shown in FIG. 40. Specifically, an upper photograph in FIG. 41 corresponds to the photograph in FIG. 40(a), and a lower photograph in FIG. 41 corresponds to the photograph in FIG. 40(b). A photograph in FIG. 42 corresponds to the photograph in FIG. 40(c).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A laser processing method, comprising the steps of:
preparing a material to be processed; and
forming a modified area in said material to be processed, by irradiating said material to be processed with pulsed laser beam, wherein in said step of forming the modified area,
the pulsed laser beam having a continuous spectrum is focused with a lens, thereby forming a focusing line constituted by a plurality of focuses distributed continuously that are obtained by said continuous spectrum of said pulsed laser beam with a predetermined spectral band, and
said material to be processed is irradiated with said pulsed laser beam, and thereby at least a part of said focusing line is located on one of surfaces of said material to be processed and an inside of said material to be processed, thereby forming said modified area on an axis of said focusing line.

2. The laser processing method according to claim 1, wherein
in said step of forming a modified area, said pulsed laser beam enters from a first surface of said material to be processed, and said modified area is formed on a second surface side located opposite to said first surface in a thickness direction of said material to be processed.

3. The laser processing method according to claim 2, wherein
in said step of preparing a material to be processed, said first surface of said material to be processed is mirror-finished and said second surface is satin-finished.

4. The laser processing method according to claim 1, wherein
said pulsed laser beam having said continuous spectrum is generated using a Raman scattering effect on pulsed laser that is seed laser of said pulsed laser beam.

5. The laser processing method according to claim 1, wherein
with respect to intensity of a maximum peak wavelength having the highest intensity among wavelength components constituting said continuous spectrum of said pulsed laser beam, total intensity of the wavelength components other than said maximum peak wavelength among the wavelength components constituting said continuous spectrum is 10% or more.

6. The laser processing method according to claim 5, wherein
the wavelength components constituting said continuous spectrum of said pulsed laser beam include one or more local peak wavelength(s) exhibiting a local maximum value of the intensity among the wavelength components other than said maximum peak wavelength, and
a maximum value of a difference between said maximum peak wavelength and said one or more local peak wavelength(s) is 100 nm or more.

7. A laser processing method comprising the steps of:
preparing a material to be processed; and
forming a modified area in said material to be processed, by irradiating said material to be processed with pulsed laser beam, wherein in said step of forming the modified area,
the pulsed laser beam having a continuous spectrum is focused with a lens, thereby forming a focusing line constituted by a plurality of focuses distributed continuously that are obtained by said continuous spectrum of said pulsed laser beam with a predetermined spectral band, and
said material to be processed is irradiated with said pulsed laser beam, thereby the whole of said focusing line is located outside said material to be processed.

8. The laser processing method according to claim 7, wherein
said pulsed laser beam having said continuous spectrum is generated using a Raman scattering effect on pulsed laser that is seed laser of said pulsed laser beam.

9. The laser processing method according to claim 7, where with respect to intensity of a maximum peak wavelength having the highest intensity among wavelength components constituting said continuous spectrum of said pulsed laser beam, total intensity of the wavelength components other than said maximum peak wavelength among the wavelength components constituting said continuous spectrum is 10% or more.

10. The laser processing method according to claim 9, wherein
the wavelength components constituting said continuous spectrum of said pulsed laser beam include one or more local peak wavelength(s) exhibiting a local maximum value of the intensity among the wavelength components other than said maximum peak wavelength, and
a maximum value of a difference between said maximum peak wavelength and said one or more local peak wavelength(s) is 100 nm or more.

11. A laser processing method, comprising the steps of:
preparing a material to be processed; and
forming a modified area in said material to be processed, by irradiating said material to be processed with pulsed laser beam, wherein in said step of forming the modified area,
the pulsed laser beam of a predetermined continuous spectral band having a spectral range of 50 nm or more is focused by focusing means, and thereby a focusing portion of each spectral component included in said predetermined continuous spectral band is formed on a straight line in a focusing direction as a predetermined focusing area, and said material to be processed is irradiated with said pulsed laser beam, and thereby said modified area generated from said predetermined focusing area on said straight line is formed inside said material to be processed.

12. The laser processing method according to claim 11, wherein
said predetermined continuous spectral band includes the spectral range having a continuous spectrum or a plurality of discrete spectra.

13. The laser processing method according to claim 11, wherein
said pulsed laser beam includes a CW component.

14. The laser processing method according to claim 11, wherein
said pulsed laser beam includes single pulsed laser obtained by synchronously combining a plurality of pulsed laser from a plurality of pulsed laser light sources that separately generate pulsed laser having different spectra.

15. The laser processing method according to claim 11, wherein
said pulsed laser beam has a component derived from fundamental pulsed laser inputted to a passive fiber, and a continuous spectral component having a spectral width of 50 nm or more and formed using a stimulated Raman scattering effect on said fundamental pulsed laser at said passive fiber.

16. The laser processing method according to claim 15, wherein
in said pulsed laser beam, power of spectral components other than a spectral range of said fundamental pulsed laser, of spectral components constituting said continuous spectral component, is 10% or more with respect to power of said fundamental pulsed laser.

17. The laser processing method according to claim 15, wherein
said continuous spectral component includes one or more local peak spectrum (spectra) in which power has a local maximum value, among components other than a peak spectral range of said fundamental pulsed laser, and a minimum interval between a peak spectrum of said fundamental pulsed laser and said one or more local peak spectrum (spectra) is 100 nm or more.

18. The laser processing method according to claim 11, wherein
in said step of forming the modified area, said material to be processed is irradiated with said pulsed laser beam such that a part or the whole of said predetermined focusing area of said pulsed laser beam is located inside said material to be processed.

19. The laser processing method according to claim 11, wherein
in said step of forming the modified area, said pulsed laser beam enters from a first surface of said material to be processed, and a part of said predetermined focusing area is set on a second surface located opposite to said first surface in a thickness direction of said material to be processed and said modified area is formed to extend from said second surface to the inside of said material to be processed.

20. The laser processing method according to claim 19, wherein
in said step of preparing a material to be processed, said second surface is non-mirror-finished to have a surface roughness Ra (JIS standard) of 0.1 μm or more and 1.0 μm or less.

21. The laser processing method according to claim 19, wherein
in said step of preparing a material to be processed, said first surface of said material to be processed is mirror-finished.

22. The laser processing method according to claim 21, wherein
in said step of preparing a material to be processed, an epitaxial layer is formed on mirror-finished said first surface of said material to be processed.

23. The laser processing method according to claim 11, wherein
said predetermined continuous spectral band includes a discrete spectral range other than the continuous spectral range of 50 nm or more.

* * * * *